United States Patent
Nam et al.

(10) Patent No.: US 9,627,201 B2
(45) Date of Patent: Apr. 18, 2017

(54) METHODS OF FORMING HOLES USING MASK PATTERN STRUCTURES

(71) Applicants: Jae-Woo Nam, Anyang-si (KR); Eun-Sung Kim, Seoul (KR)

(72) Inventors: Jae-Woo Nam, Anyang-si (KR); Eun-Sung Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 20 days.

(21) Appl. No.: 14/687,453

(22) Filed: Apr. 15, 2015

(65) Prior Publication Data

US 2016/0064235 A1   Mar. 3, 2016

(30) Foreign Application Priority Data

Sep. 2, 2014  (KR) .................. 10-2014-0115954

(51) Int. Cl.
  *H01L 21/027*  (2006.01)
  *H01L 21/033*  (2006.01)
  *H01L 21/311*  (2006.01)

(52) U.S. Cl.
  CPC ...... *H01L 21/0271* (2013.01); *H01L 21/0337* (2013.01); *H01L 21/31144* (2013.01)

(58) Field of Classification Search
  CPC ............. H01L 21/3081; H01L 21/0276; H01L 21/02118; H01L 21/3086; H01L 21/02; H01L 21/027; H01L 21/0337
  See application file for complete search history.

(56) References Cited

U.S. PATENT DOCUMENTS

| | | |
|---|---|---|
| 7,811,940 B2 | 10/2010 | Sandhu |
| 7,923,373 B2 | 4/2011 | Sandhu |
| 8,187,480 B2 | 5/2012 | Lee et al. |
| 8,257,598 B2 | 9/2012 | Albrecht et al. |
| 8,394,483 B2 | 3/2013 | Millward |
| 8,486,613 B2 | 7/2013 | Kim et al. |
| 8,518,275 B2 | 8/2013 | Millward et al. |
| 8,691,925 B2 | 4/2014 | Wu et al. |
| 2009/0196488 A1 | 8/2009 | Nealey et al. |
| 2013/0309457 A1 | 11/2013 | Rathsack et al. |
| 2015/0235839 A1* | 8/2015 | Coskun ............... H01L 21/0274 438/694 |

* cited by examiner

*Primary Examiner* — Selim Ahmed

(74) *Attorney, Agent, or Firm* — Volentine & Whitt, PLLC

(57) ABSTRACT

In a method of forming holes, a plurality of guide patterns physically spaced apart from each other is formed on an object layer. The guide pattern has a ring shape and includes a first opening therein. A self-aligned layer is formed on the object layer and the guide patterns to fill the first opening. Preliminary holes are formed by removing portions of the self-aligned layer which are self-assembled in the first opening and between the guide patterns neighboring each other. The object layer is partially etched through the preliminary holes.

20 Claims, 45 Drawing Sheets

METHODS OF FORMING HOLES USING MASK PATTERN STRUCTURES

CROSS-REFERENCE TO RELATED APPLICATION

This application claims priority under 35 USC §119 to Korean Patent Application No. 10-2014-0115954, filed on Sep. 2, 2014, in the Korean Intellectual Property Office (KIPO), the contents of which are incorporated by reference herein in their entirety.

BACKGROUND

1. Field

Example embodiments relate to mask pattern structures, methods of forming holes using the same, and methods of manufacturing semiconductor devices using the same. More particularly, example embodiments relate to mask pattern structures for forming minute holes, methods of forming holes using the same, and methods of manufacturing semiconductor devices using the same.

2. Description of the Related Art

As a degree of integration and a capacity of a semiconductor device become increased, methods of forming patterns of fine and minute dimensions have been researched. In a conventional photolithography process, e.g., an exposure device has been developed for forming the fine and minute patterns. However, a pattern having a critical dimension below, e.g., 40 nm is difficult to obtain through the photolithography process due to a resolution limit. Thus, a double patterning method (e.g., using at least two mask types) has been researched. However, the double patterning method may require complicated steps and excessive process cost.

Accordingly, a direct self assembly (DSA) method using a block copolymer has been developed.

SUMMARY

Example embodiments provide a mask pattern structure obtained by a DSA method.

Example embodiments provide a method of forming holes through the mask pattern structure.

Example embodiments provide a method of manufacturing a semiconductor device through the mask pattern structure.

According to example embodiments, there is provided a method of forming holes. In the method, a plurality of guide patterns physically spaced apart from each other is formed on an object layer. The guide pattern has a ring shape and includes a first opening therein. A self-aligned layer is formed on the object layer and the guide patterns to fill the first opening. Preliminary holes are formed by removing portions of the self-aligned layer which are self-assembled in the first opening and between the guide patterns neighboring each other. The object layer is partially etched through the preliminary holes.

In example embodiments, the self-aligned layer may be formed using a block copolymer that includes a first polymer unit and a second polymer unit different from each other. In the formation of the self-aligned layer on the object layer and the guide patterns, a first self-aligned pattern self-assembled at a central portion of the first opening and between the guide patterns neighboring each other and a second self-aligned pattern self-assembled on a remaining portion of the object layer except for a portion of the object layer on which the first self-aligned pattern is formed may be formed. The first self-aligned pattern and the second self-aligned pattern may include the first polymer unit and the second polymer unit, respectively.

In example embodiments, the first self-aligned pattern may include a first pillar self-assembled at the central portion of the first opening, and a second pillar self-assembled between the guide patterns neighboring each other. A plurality of the second pillars may surround one of the guide patterns or one of the first pillars.

In example embodiments, the second pillar may be self-assembled on at least one from central points of 2, 3 and 4 of the first pillars.

In example embodiments, the second self-aligned pattern may be divided into a first portion self-assembled at a peripheral portion of the first opening, and a second portion self-assembled at an outside of the guide patterns.

In example embodiments, the first portion of the second self-aligned pattern may have a ring shape laterally surrounding the first pillar of the first self-aligned pattern. The second pillars of the first self-aligned pattern may be buried in the second portion of the second self-aligned pattern.

In example embodiments, in the formation of the preliminary holes, the first pillar and the second pillar may be removed.

In example embodiments, the first polymer unit may include polymethylmethacrylate (PMMA), and the second polymer unit may include polystyrene (PS).

In example embodiments, a neutral layer may be further formed along surfaces of the object layer and the guide patterns before forming the self-aligned layer.

In example embodiments, in the formation of the plurality of the guide patterns, a plurality of sacrificial layer patterns may be formed on the object layer. The sacrificial layer pattern may have a pillar shape. A guide layer may be formed along surfaces of the object layer and the sacrificial layer patterns. The guide layer may be partially removed to form the guide pattern surrounding a sidewall of each of the sacrificial layer patterns. The sacrificial layer patterns may be removed.

In example embodiments, in removing the guide layer, portions of the guide layer formed on top surfaces of the object layer and the sacrificial layer patterns may be removed by an etch-back process.

In example embodiments, in the formation of the plurality of the guide patterns, an intermediate layer may be formed on the object layer. A plurality of sacrificial layer patterns may be formed on the intermediate layer. The sacrificial layer pattern may have a pillar shape. The intermediate layer may be partially etched using the sacrificial layer patterns to form a plurality of intermediate layer patterns having a pillar shape. The sacrificial layer patterns may be removed. A guide layer may be formed along surfaces of the object layer and the intermediate layer patterns. The guide layer may be partially removed to form the guide pattern surrounding a sidewall of each of the intermediate layer patterns. The intermediate layer patterns may be removed.

In example embodiments, the intermediate layer may serve as an anti-reflection layer, and the sacrificial layer pattern may include a negative-type photoresist material.

In example embodiments, while partially etching the intermediate layer using the sacrificial layer patterns, an upper portion of the object layer may be partially removed such that a stepped portion protruding from a top surface of the object layer may be formed under the intermediate layer pattern.

In example embodiments, the guide pattern may surround the sidewall of the intermediate layer pattern and a sidewall of the stepped portion.

In example embodiments, in the formation of the plurality of the guide patterns, a sacrificial layer pattern that may include a plurality of openings therein may be formed on the object layer. A guide layer may be formed on sidewalls and bottoms of the openings. Portions of the guide layer which are formed on the bottoms of the openings may be removed to form the guide pattern on the sidewall of each of the openings. The sacrificial layer pattern may be removed.

In example embodiments, an intermediate layer may be further formed on the object layer before forming the sacrificial layer pattern. The intermediate layer may be partially removed through the openings such that the openings may be extended to expose the object layer.

In example embodiments, an upper portion of the object layer exposed by the extended openings may be partially etched.

In example embodiments, the intermediate layer may serve as an anti-reflection layer, and the sacrificial layer pattern may include a positive-type photoresist material.

According to example embodiments, there is provided a method of forming holes. In the method, a sacrificial layer pattern is formed on an object layer. The sacrificial layer pattern includes a plurality of pillar patterns or a plurality of openings. A guide layer is formed along the object layer and the sacrificial layer pattern. The guide layer may be partially removed to form guide patterns spaced apart from each other. The guide pattern has a ring shape. The sacrificial layer pattern is removed. A self-aligned layer is formed on the object layer to fill the guide patterns. Portions of the self-aligned layer which are self-assembled at an inside of the guide pattern and between the guide patterns neighboring each other are partially removed to form preliminary holes. The object layer is partially removed through the preliminary holes.

In example embodiments, the sacrificial layer pattern may include the plurality of the pillar patterns. In partially removing the guide layer, portions of the guide layer formed on top surfaces of the object layer and the sacrificial layer pattern may be removed, and the guide pattern may surround a sidewall of the sacrificial layer pattern.

In example embodiments, the sacrificial layer pattern may include the plurality of the openings. In partially removing the guide layer, portions of the guide layer formed on a top surface of the sacrificial layer pattern and a bottom of the opening may be removed, and the guide pattern may be formed on a sidewall of the opening.

In example embodiments, the self-aligned layer may include a first polymer unit and a second polymer unit having different chemical properties. The first polymer unit may be self-assembled at a central portion of the inside of the guide pattern and between the guide patterns neighboring each other to form a plurality of pillars. The second polymer unit may be self-assembled at a peripheral portion of the inside of the guide pattern and at an outside of the guide patterns. The plurality of the pillars may be removed to form the preliminary holes.

According to example embodiments, there is provided a method of manufacturing a semiconductor device. In the method, insulating interlayers and sacrificial layers are formed alternately and repeatedly on a substrate to form a mold structure. A plurality of guide patterns spaced apart from each other is formed on the mold structure. The guide pattern has a ring shape and includes an opening therein. A self-aligned layer is formed on the mold structure and the guide patterns to fill the opening. Portions of the self-aligned layer which are self-assembled in the opening and between the guide patterns neighboring each other are partially removed to form preliminary holes. The mold structure is etched through the preliminary holes to form channel holes through which a top surface of the substrate is exposed. A channel is formed in each of the channel holes. The sacrificial layers are replaced with gate electrodes.

In example embodiments, a hard mask layer may be further formed on the mold structure before forming the plurality of the guide patterns. The hard mask layer may be etched through the preliminary holes to form a hard mask including a plurality of holes.

In example embodiments, in replacing the sacrificial layers with the gate electrodes, a portion of the mold structure between some of the channels neighboring each other may be etched to form a trench. The sacrificial layers exposed by a sidewall of the trench may be removed.

According to example embodiments, there is provided a method of manufacturing a semiconductor device. In the method, active patterns defined by an isolation layer are formed on a substrate. Gate structures that extend through the active patterns and the isolation layer are formed. An impurity region is formed at an upper portion of the active pattern adjacent to the gate structure. An insulating interlayer that covers the isolation layer and the active patterns is formed. A plurality of guide patterns spaced apart from each other is formed on the insulating interlayer. The guide pattern has a ring shape and includes an opening therein. A self-aligned layer is formed on the insulating interlayer and the guide patterns to fill the opening. Portions of the self-aligned layer which are self-assembled in the opening and between the guide patterns neighboring each other are partially removed to form preliminary holes. The insulating interlayer is etched through the preliminary holes to form contact holes. The impurity region is exposed through the contact hole. A conductive contact electrically connected to the impurity region is formed in the contact hole.

In example embodiments, the impurity region may include a first impurity region formed between the gate structures, and a second impurity region formed at a peripheral portion of the active pattern. The second impurity region may be exposed through the contact hole.

In example embodiments, a conductive line structure electrically connected to the first impurity region may be further formed.

In example embodiments, a capacitor electrically connected to the conductive contact may be further formed.

In example embodiments, a hard mask layer may be further formed on the insulating interlayer before forming the plurality of the guide patterns.

According to example embodiments, there is provided a mask pattern structure. The mask pattern structure includes a plurality of guide patterns spaced apart from each other on an object layer, a first self-aligned pattern and a second self-aligned pattern. The guide pattern has a ring shape and includes an opening therein. The first self-aligned pattern is self-assembled as a plurality of pillars at a central portion of the opening and between the guide patterns neighboring each other. The first self-aligned pattern includes a first polymer unit. The second self-aligned pattern is self-assembled at a peripheral portion of the opening, and at an outside of the guide patterns. The second self-aligned pattern includes a second polymer unit.

In example embodiments, the first polymer unit may include polymethylmethacrylate (PMMA), and the second polymer unit may include polystyrene (PS).

In example embodiments, the mask pattern structure may further include a neutral layer formed along surfaces of the object layer and the guide patterns. The first self-aligned pattern and the second aligned pattern may be disposed on the neutral layer.

In example embodiments, the first self-aligned pattern may includes first pillars self-assembled at the central portion of the opening, and second pillars self-assembled at a central point of the first pillars neighboring each other.

According to example embodiments, there is provided a method of forming a hole in a semiconductor device. The method includes forming, over an intermediate layer, a pillar of a sacrificial material; forming a guide layer circumferentially on an outer periphery of the pillar in the form of a wall; removing the sacrificial material so as to create a well of open space where the sacrificial material previously existed within the confines of the guide-layer wall; forming a neutral layer over the intermediate layer and guide layer; creating an etching component by forming an etching mask on a first region of the neutral layer that does not include the bottom of the well of open space within the confines of the guide-layer wall; and etching the etching component to remove material of the neutral and intermediate layers underlying a second region of the neutral layer that is not protected by the etching mask.

In example embodiments, the method further includes forming an object layer on a substrate and forming the intermediate layer on the object layer. The etching further removes material of the object layer underlying the second region.

In example embodiments, the method further includes removing the etching mask, the guide layer, and the remaining portions of the neutral and intermediate layers; and filling a removed portion of the object layer with a conductor that makes electrical contact with a conductor within the substrate.

In example embodiments, the method further includes growing a first pillar of material extending from the neutral layer up through the center of the well of open space within the confines of the guide-layer wall. The forming of the etching mask includes forming the etching mask in space existing between the first pillar of material and the neutral layer existing on the inner periphery of the guide-layer wall.

In example embodiments, the first pillar of material is grown up through the center of the well of open space within the confines of the guide-layer wall by directing polymethylmethacrylate (PMMA) into the well of open space within the confines of the guide-layer wall.

In example embodiments, the method further includes growing a second pillar of material extending from the neutral layer up through an open space outside the guide-layer wall. The etching removes the first and second pillars and the material of the neutral and intermediate layers underlying the first and second pillars.

BRIEF DESCRIPTION OF THE DRAWINGS

Example embodiments will be more clearly understood from the following detailed description taken in conjunction with the accompanying drawings.

FIGS. 1 and 2 are a top plan view and a cross-sectional view, respectively, illustrating a mask pattern structure in accordance with example embodiments;

FIGS. 62A, 62B, and 63 to 69 are top plan views and cross-sectional views illustrating a method of manufacturing a semiconductor device in accordance example embodiments.

DESCRIPTION OF EMBODIMENTS

Figure 1:
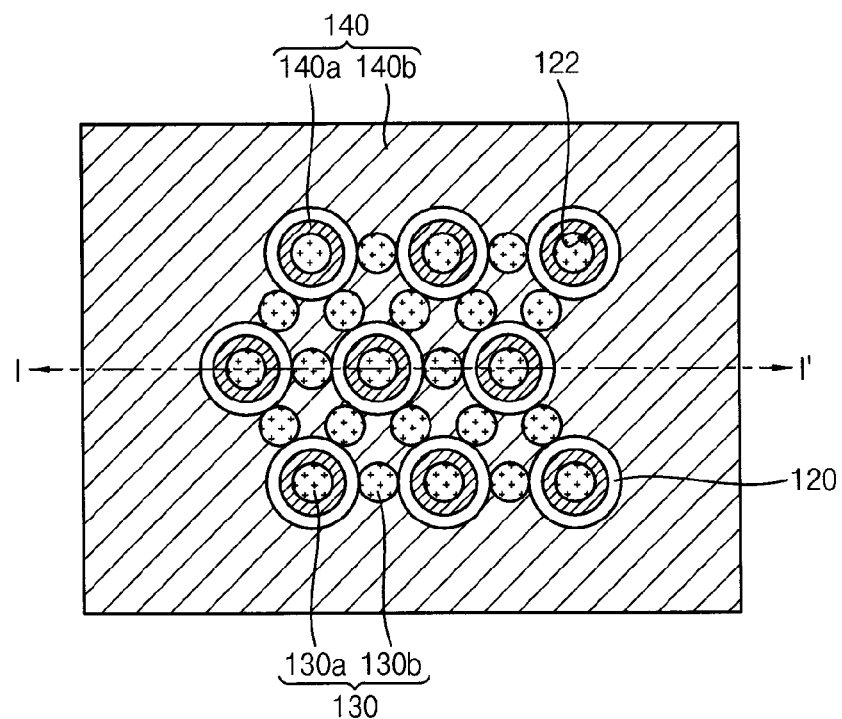
FIGS. 1 to 69 represent non-limiting, example embodiments as described herein.

Various example embodiments will be described more fully hereinafter with reference to the accompanying drawings, in which some example embodiments are shown. The present application may, however, be embodied in many different forms and should not be construed as limited to the example embodiments set forth herein. Rather, these example embodiments are provided so that this description will be thorough and complete, and will fully convey the scope of the present application to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present application.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present application. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present application.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
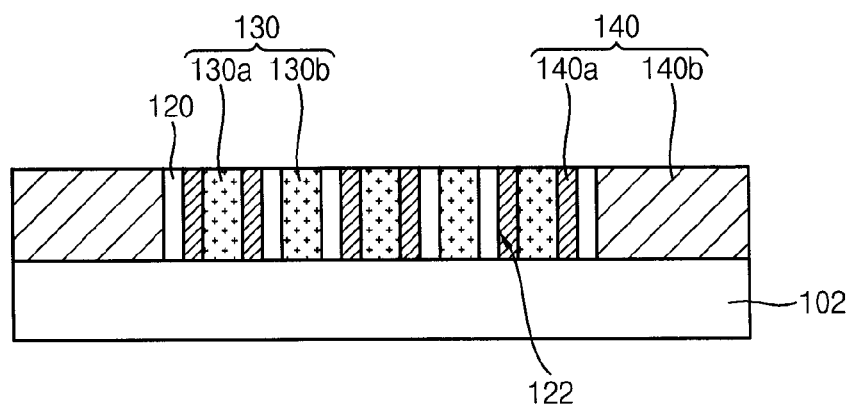

FIGS. 1 and 2 are a top plan view and a cross-sectional view, respectively, illustrating a mask pattern structure in accordance with example embodiments. Specifically, FIG. 2 is a cross-sectional view taken along a line I-I' of FIG. 1.

Referring to FIGS. 1 and 2, the mask pattern structure may include a guide pattern 120, a first self-aligned pattern 130 and a second self-aligned pattern 140 formed on an object layer 102.

The object layer 102 may be a layer to be partially etched using the mask structure pattern. In example embodiments, the object layer 102 may be partially etched to be converted into a pattern including a plurality of holes. For example, the plurality of holes may be formed in the object layer 102, and points on a top surface of the object layer 102 at which the holes may be formed may define a grid.

For example, the object layer 102 may include an insulation material such as silicon oxide, silicon nitride or silicon oxynitride. Alternatively, the object layer 102 may include a conductive material such as doped polysilicon, a metal, a metal nitride or a metal silicide. In an embodiment, the object layer 102 may be a mask layer including a carbon-based or silicon-based spin-on hard mask (SOH) material.

The guide patterns 120 may be formed at some points among the points on which the holes may be formed to form a guide pattern array.

In example embodiments, the guide pattern 120 may have a ring shape or a hollow cylindrical shape. Accordingly, each guide pattern 120 may include an opening 122 therein.

A plurality of the guide patterns 120 having the ring shape or the hollow cylindrical shape may be physically separated from each other as illustrated in FIG. 1.

The guide pattern 120 may include a hydrophilic material. For example, the guide pattern 120 may include a silicon oxide-based material such as an atomic layer deposition (ALD) oxide.

The first self-aligned patterns 130 may be aligned at a central portion of the opening 122 of each guide pattern 120, and at a position between the neighboring guide patterns 120. Accordingly, a plurality of the first self-aligned patterns 130 may be arranged to form an array substantially the same as the grid. In example embodiments, a width or a diameter of the first self-aligned pattern 130 may be substantially the same as that of the hole to be formed in the object layer 102.

In example embodiments, the first self-aligned pattern 130 may have a substantially pillar shape, and may include a first pillar 130a arranged at the central portion of the opening 122, and a second pillar 130b arranged between the first pillars 130a neighboring each other.

The second pillar 130b may be formed between the neighboring guide patterns 120.

In example embodiments, as illustrated in FIGS. 1 and 2, the second pillar 130b may be in contact with outer sidewalls of the neighboring guide patterns 120. Further, the second pillar 130b may be arranged at a central point of two neighboring first pillars 130a. In this case, one of the second pillars 130b may be in contact with the outer sidewalls of two of the guide patterns 120.

A plurality of the second pillars 130b may be arranged around the outer sidewall of the one guide pattern 120. For example, six second pillars 130b may be arranged around the first pillar 130a formed at the central portion of the opening 122. However, the arrangement of the second pillars 130b may not be specifically limited, and may be adjusted according to the grid and/or the guide pattern array.

In example embodiments, the first self-aligned pattern 130 may include a polymer material having hydrophilic and self-assembling properties. For example, the first self-aligned pattern 130 may include polymethylmethacrylate (PMMA), polydimethylsiloxane (PDMS), polyvinylpyrrolidone (PVP), polyethyleneoxide (PEO) or polyimide (PI). In some embodiments, the first self-aligned pattern 130 may include PMMA.

The second self-aligned patterns 140 may be aligned at a peripheral portion in the opening 122 of each guide pattern 120, and on the object layer 102 outside the guide patterns 120. The second self-aligned patterns 140 may be divided into a first portion 140a aligned at the peripheral portion of the opening 122, and a second portion 140b aligned at an outside of the guide patterns 120.

In example embodiments, the first portion 140a may fill a remaining portion of the opening 122 that may be partially filled with the first pillar 130a of the first self-aligned pattern 130. The first portion 140a may have a ring shape, and a plurality of the first portions 140a may be formed in respective guide patterns 120, and may be spaced apart from each other.

The second portion 140b may be aligned at the outside of the guide patterns 120, and may be formed on the outer sidewalls of the guide patterns 120, and sidewalls of the second pillars 130b, and on the top surface of the object layer 100. In some embodiments, the second portion 140b may be provided as a continuous unitary member. In this case, the second pillars 130b may be inserted in the second portion 140b.

In example embodiments, the second aligned pattern 140 may include a polymer material having a self-assembling property and being different from the polymer material of the first self-aligned pattern 130. For example, the second self-aligned pattern 140 may include polystyrene (PS).

In some embodiments, an intermediate layer such as an anti-reflection coating (ARC) layer may be interposed between the mask pattern structure and the object layer 102. In some embodiments, a hard mask layer including, e.g., a spin-on hard mask (SOH) material may be further disposed on and/or under the object layer 102.

In example embodiments, the first self-aligned pattern 130 may be removed from the mask pattern structure to form preliminary holes, and the object layer 102 may be etched through the preliminary holes to form the holes.

Figure 3:
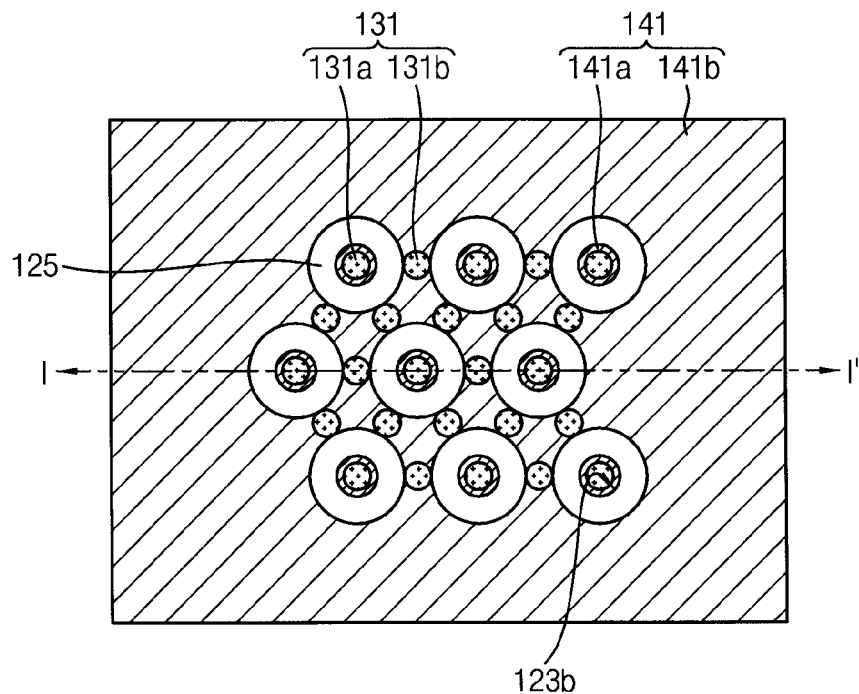
FIGS. 3 and 4 are a top plan view and a cross-sectional view, respectively, illustrating a mask pattern structure in accordance with some example embodiments.
Figure 4:
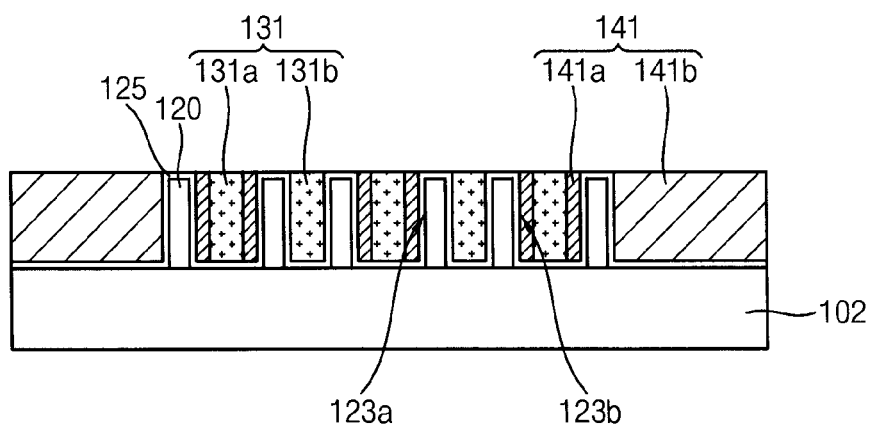

FIGS. 3 and 4 are a top plan view and a cross-sectional view, respectively, illustrating a mask pattern structure in accordance with some example embodiments. Specifically, FIG. 4 is a cross-sectional view taken along a line I-I' of FIG. 3.

Detailed descriptions on elements and/or constructions substantially the same as or similar to those illustrated with reference to FIGS. 1 and 2 are omitted, and like reference numerals are used to designate like elements.

Referring to FIGS. 3 and 4, and as also illustrated with reference to FIGS. 1 and 2, a plurality of guide patterns 120, each of which may include a first opening 123a therein may be arranged on an object layer 102.

A neutral layer 125 may be formed conformally along a top surface of the object layer 102, surfaces of the guide patterns 120, and bottoms of the first openings 123a.

In example embodiments, the neutral layer 125 may include a random copolymer that may be prepared by a random co-polymerization of a first polymer unit and a second polymer unit. The first polymer unit may include, e.g., PMMA, PDMS, PVP, PEO or PI. The second polymer unit may include, e.g., PS. Accordingly, the random copolymer may be represented as PS-r-PMMA, PS-r-PDMS, PS-r-PVP, PS-r-PEO or PS-r-PI. In an embodiment, the neutral layer 125 may include PS-r-PMMA.

As the neutral layer 125 covers the guide pattern 120, the first opening 123a may be converted into a second opening 123b having a reduced width. First self-aligned patterns 131 may be arranged at a central portion on the second opening 123b, and between the guide patterns 120 neighboring each other. Second self-aligned patterns 141 may be arranged at a peripheral portion of the second opening 123b, and on the neutral layer 125 outside the guide patterns 120.

As illustrated with reference to FIGS. 1 and 2, the first self-aligned pattern 131 may have a substantially pillar shape, and may include a first pillar 131a arranged at the central portion on the second opening 123b, and a second pillar 131b arranged between the first pillars 131a neighboring each other.

In some embodiments, the second pillar 131b may be formed between the neighboring guide patterns 120 and may be in contact with a portion of the neutral layer 125 formed on an outer sidewall of the guide pattern 120. For example, the second pillar 131b may be arranged substantially at a central point of two neighboring first pillars 131a.

As illustrated in FIG. 3, a plurality of the second pillars 131b may be arranged around one guide pattern 120 or one first pillar 131a. For example, six second pillars 131b may be arranged at vertices of a hexagon, and the first pillar 131a may be arranged at a central point of the hexagon.

The second self-aligned pattern 141 may be arranged at a peripheral portion of the second opening 123b, and on the neutral layer 125 outside the guide patterns 120. The second self-aligned patterns 141 may be divided into a first portion 141a having a ring shape and being arranged at the peripheral portion of the second opening 123b, and a second portion 141b arranged at an outside of the guide patterns 120 and surrounding sidewalls of the second pillars 131b.

Figure 5:
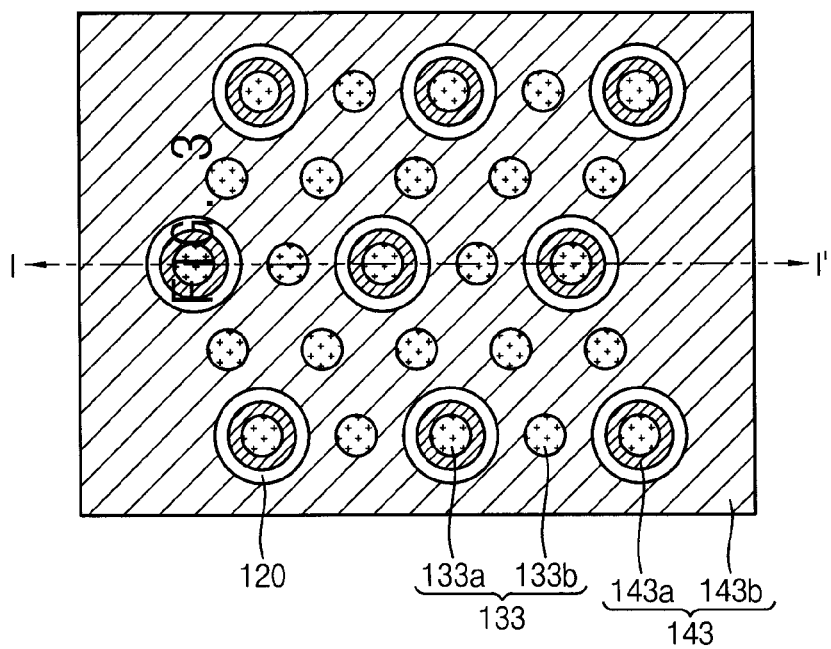
FIGS. 5 and 6 are a top plan view and a cross-sectional view, respectively, illustrating a mask pattern structure in accordance with some example embodiments.
Figure 6:
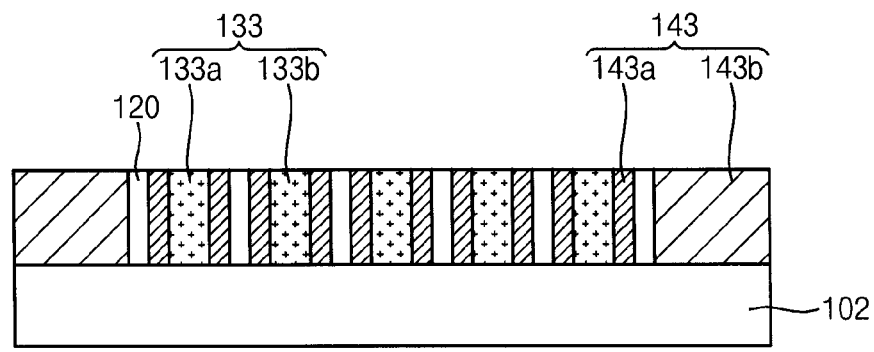

FIGS. 5 and 6 are a top plan view and a cross-sectional view, respectively, illustrating a mask pattern structure in accordance with some example embodiments. Specifically, FIG. 6 is a cross-sectional view taken along a line I-I' of FIG. 5.

Referring to FIGS. 5 and 6, first self-aligned patterns 133 may include a first pillar 133a arranged in a guide pattern 120, and a second pillar 133b arranged between the guide patterns 120 neighboring each other.

In some embodiments, the second pillar 133b may be self-assembled to be spaced apart from an outer sidewall of the guide pattern 120. For example, as a distance between the neighboring guide patterns 120 becomes increased, the second pillar 133b may be spaced apart from the outer sidewall of the guide pattern 120, and may be aligned substantially at a central point of two first pillars 133a neighboring each other.

Second self-aligned patterns 143 may include a first portion 143a surrounding a sidewall of the first pillar 133a in the guide pattern 120, and a second portion 143b surrounding a plurality of the second pillars 133b outside the guide pattern 120.

Figure 7:
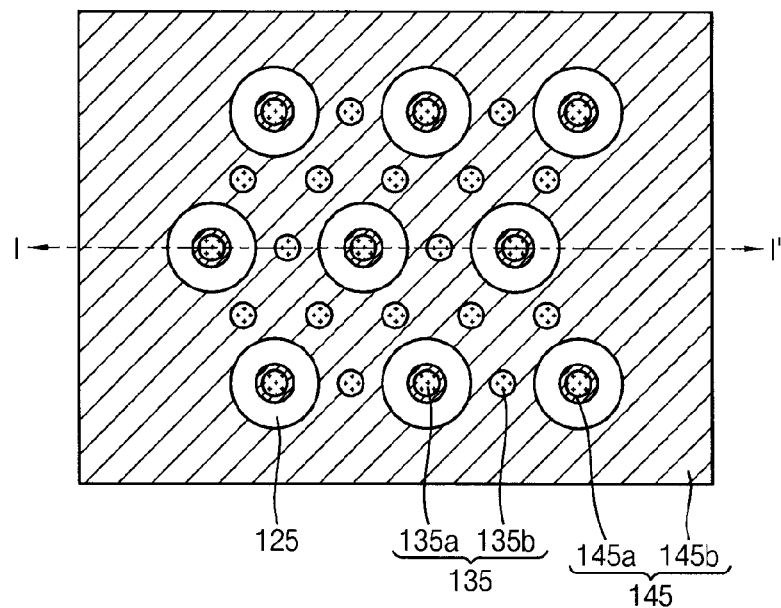
FIGS. 7 and 8 are a top plan view and a cross-sectional view, respectively, illustrating a mask pattern structure in accordance with some example embodiments.
Figure 8:
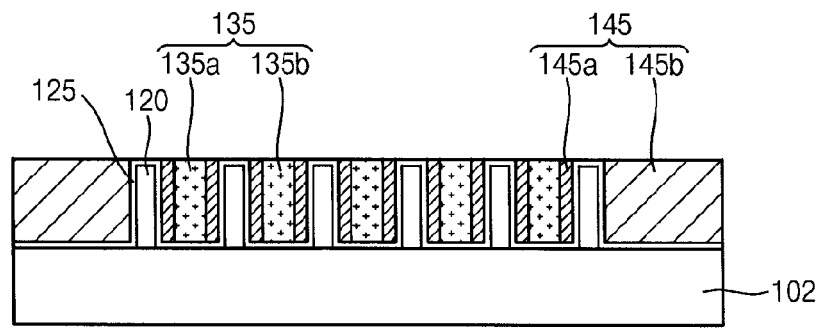

FIGS. 7 and 8 are a top plan view and a cross-sectional view, respectively, illustrating a mask pattern structure in accordance with some example embodiments. Specifically, FIG. 8 is a cross-sectional view taken along a line I-I' of FIG. 7.

Referring to FIGS. 7 and 8, and as also illustrated in FIGS. 3 and 4, a neutral layer 125 may be formed conformally along surfaces of guide patterns 120 and a top surface of an object layer 102. An inner width of the guide pattern 120 may be reduced by the neutral layer 125, and a first pillar 135a of a first self-aligned pattern 135 may be aligned in the guide pattern 120.

A second pillar 135b of the first self-aligned pattern 135 may be spaced apart from an outer sidewall of the guide pattern 120, and may be self-assembled between the neighboring guide patterns 120 or between the neighboring first pillars 135a. For example, the second pillar 135b may be aligned substantially at a central point of two first pillars 135a neighboring each other.

Second self-aligned patterns 145 may include a first portion 145a surrounding a sidewall of the first pillar 135a in the guide pattern 120, and a second portion 145*b* surrounding a plurality of the second pillars 135*b* outside the guide pattern 120.

Figure 9:
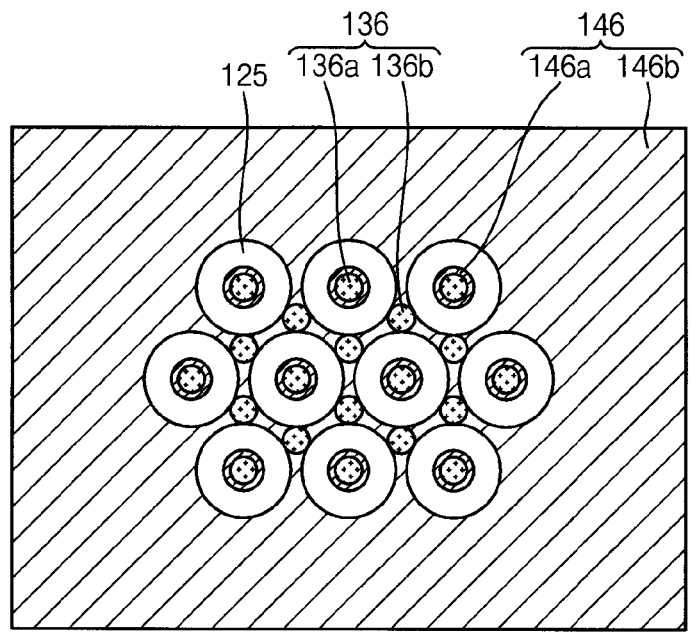
FIGS. 9 and 10 are top plan views illustrating mask pattern structures in accordance with some example embodiments.
Figure 10:
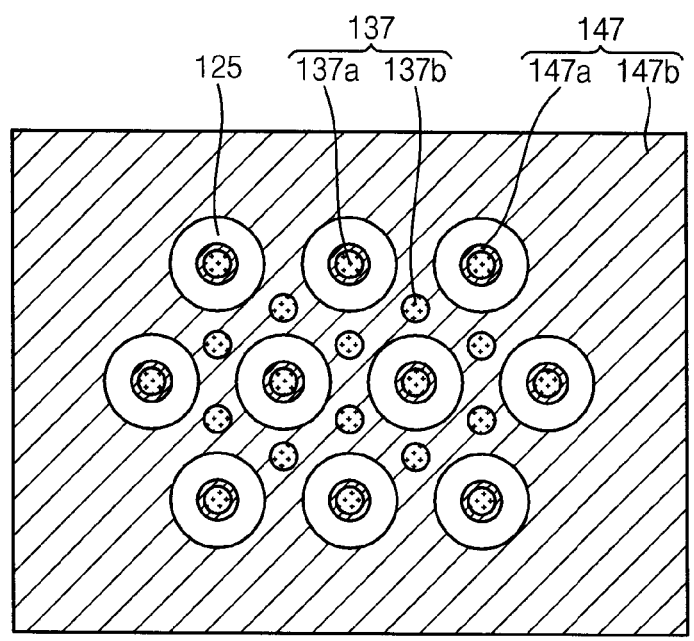

FIGS. 9 and 10 are top plan views illustrating mask pattern structures in accordance with some example embodiments.

First self-aligned patterns 136 and 137 may include first pillars 136*a* and 137*a* that may be aligned in a portion of a neutral layer 125 surrounding a guide pattern, and second pillars 136*b* and 137*b* aligned between the guide patterns neighboring each other.

In some embodiments, the second pillar 136*b* and 137*b* may be aligned substantially at a central point of three first pillars 136*a* and 137*a* neighboring each other or three guide patterns neighboring each other.

Second self-aligned patterns 146 and 147 may include first portions 146*a* and 147*a* aligned in the guide pattern and surrounding the first pillars 136*a* and 137*a*, and second portions 146*b* and 147*b* aligned at an outside of the guide pattern and surrounding a plurality of the second pillars 136*b* and 137*b*

In some embodiments, as illustrated in FIG. 9, the second pillar 136*b* may be in contact with a portion of the neutral layer 125 formed on an outer sidewall of the guide pattern. In an embodiment, as illustrated in FIGS. 1 and 2, the neutral layer 125 may be omitted. In this case, the second pillar 136*b* may be in contact with the outer sidewall of the guide pattern. For example, one second pillar 136*b* may be in contact with the outer sidewalls of three guide patterns.

In some embodiments, as illustrated in FIG. 10, the second pillar 137*b* may be spaced apart from the portion of the neutral layer 125 formed on the outer sidewall of the guide pattern. In an embodiment, as illustrated in FIGS. 1 and 2, if the neutral layer 125 is omitted, the second pillar 137*b* may be aligned to be spaced apart from the outer sidewall of the guide pattern.

Figure 11:
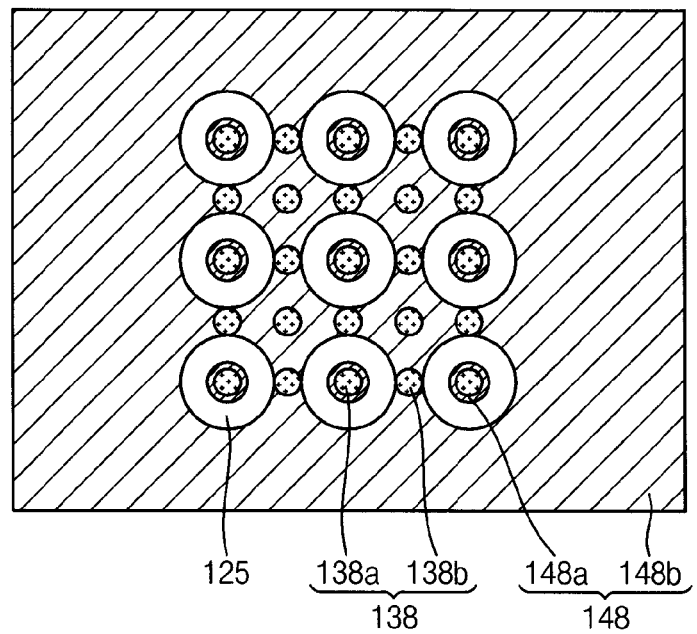
FIGS. 11 and 12 are top plan views illustrating mask pattern structures in accordance with some example embodiments.
Figure 12:
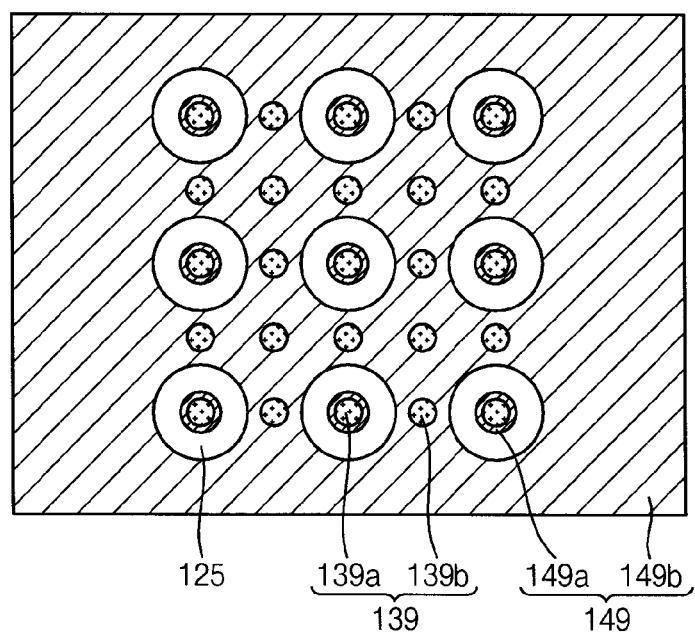

FIGS. 11 and 12 are top plan views illustrating mask pattern structures in accordance with some example embodiments;

Referring to FIGS. 11 and 12, first self-aligned patterns 138 and 139 may include first pillars 138*a* and 139*a* aligned in a portion of a neutral layer 125 surrounding a guide pattern, and second pillars 138*b* and 139*b* aligned between the guide patterns neighboring each other.

In some embodiments, a plurality of the second pillars 138*b* and 139*b* may be formed. Some of the second pillars 138*b* and 139*b* may be aligned substantially at central points of two first pillars 138*a* and 139*a* neighboring each other. Some of the second pillars 138*b* and 139*b* may be aligned substantially at central points of four first pillars 138*a* and 139*a* neighboring each other. Accordingly, the second pillars 138*b* and 139*b* may include the pillars aligned at double points, and the pillars aligned at quadruple points.

For example, eight second pillars 138*b* and 139*b* may be arranged around one first pillar 138*a* and 139*a*, or around one guide pattern.

Second self-aligned patterns 148 and 149 may include first portions 148*a* and 149*a* aligned in the guide pattern and surrounding a sidewall of the first pillar 138*a* and 139*a*, and second portions 148*b* and 149*b* aligned at an outside of the guide pattern and surrounding the plurality of the second pillars 138*b* and 139*b*.

In some embodiments, as illustrated in FIG. 11, some of the second pillars 138*b* may be in contact with a portion of the neutral layer 125 formed on an outer sidewall of the guide pattern. For example, the second pillar 138*b* aligned at the double point may be in contact with the portion of the neutral layer 125 formed on the outer sidewall of the guide pattern. The second pillar 138*b* aligned at the quadruple point may be spaced apart from the portion of the neutral layer 125 formed on the outer sidewall of the guide pattern.

In an embodiment, as illustrated in FIGS. 1 and 2, if the neutral layer 125 is omitted, the second pillar 138*b* aligned at the double point may be in contact with the outer sidewall of the guide pattern.

In some embodiments, as illustrated in FIG. 12, the second pillar 139*b* may be spaced apart from the portion of the neutral layer 125 formed on the outer sidewall of the guide pattern. In an embodiment, as illustrated in FIGS. 1 and 2, if the neutral layer 125 is omitted, the second pillar 139*b* may be aligned to be spaced apart from the outer sidewall of the guide pattern.

According to example embodiments as described above, an arrangement of the guide patterns 120 may be adjusted in advance, so that positions or arrangements of the first and second pillars may be controlled. Thus, the mask structure including the first and second pillars self-aligned according to a predetermined grid shape may be prepared, and contact holes having a fine pitch or a fine width may be formed using the mask pattern structure.

FIGS. 13 to 26 are top plan views and cross-sectional views illustrating a method of forming holes in accordance example embodiments.

Specifically, FIGS. 13, 17, 19, 21 and 23 are top plan views illustrating the method. FIGS. 14 to 16, 18, 20, 22, and 24 to 26 are cross-sectional views taken along lines I-I' indicated in the above top plan views.

Figure 13:
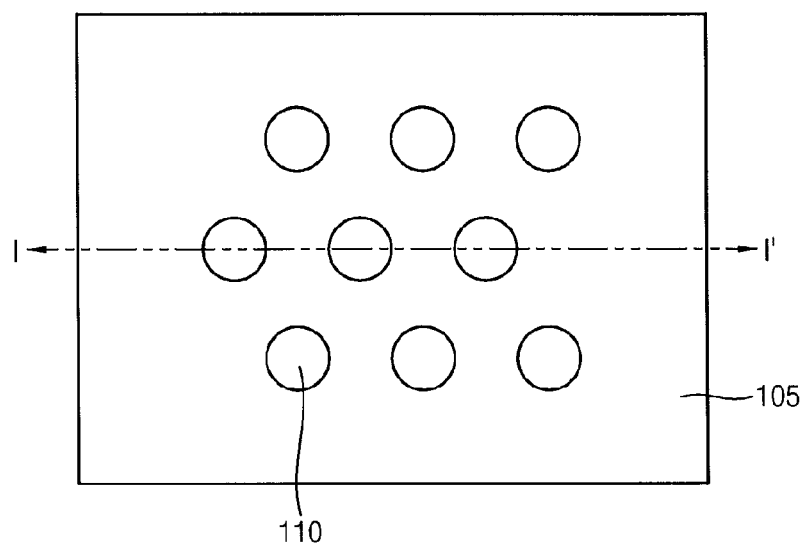
FIGS. 13 to 26 are top plan views and cross-sectional views illustrating a method of forming holes in accordance with example embodiments.
Figure 14:
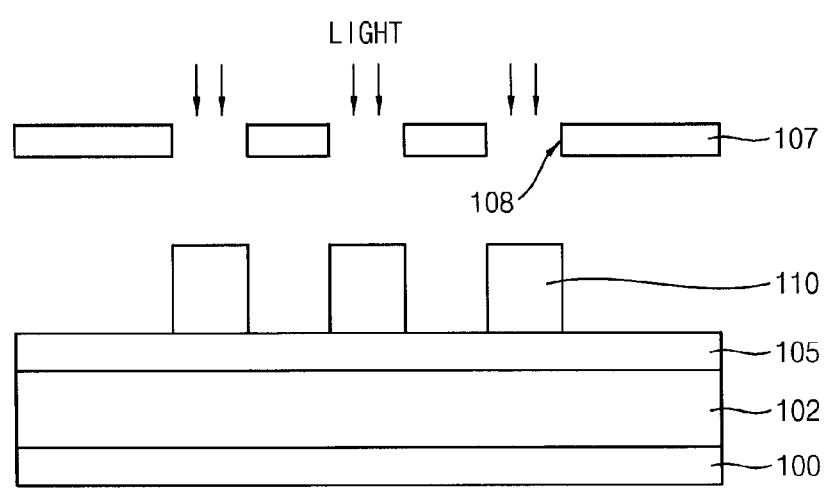

Referring to FIGS. 13 and 14, an object layer 102 and an intermediate layer 105 may be sequentially formed on a substrate 100, and sacrificial layer patterns 110 may be formed on the intermediate layer 105.

The substrate 100 may include silicon, germanium, silicon-germanium or a group III-V compound such as GaP, GaAs, GaSb, etc. In some embodiments, the substrate 100 may be a silicon-on-insulator (SOI) substrate or a germanium-on-insulator (GOI) substrate.

The object layer 102 may be partially etched to be converted into a pattern including a plurality of holes. For example, the plurality of the holes may be formed in the object layer 102, and points on a top surface of the object layer 102 at which the holes may be formed may define a grid.

For example, the object layer 102 may be formed of an insulation material such as silicon oxide, silicon nitride or silicon oxynitride. Alternatively, the object layer 102 may be formed of a conductive material such as doped polysilicon, a metal, a metal nitride or a metal silicide. In an embodiment, the object layer 102 may serve as a hard mask layer including, e.g., an SOH material.

The intermediate layer 105 may be formed on a substantially entire top surface of the object layer 102. In example embodiments, the intermediate layer 105 may serve as an ARC layer including, e.g., a nitride, an oxide or an oxynitride of a metal such as molybdenum (Mo) or chrome (Cr). In an embodiment, the formation of the intermediate layer 105 may be omitted.

A sacrificial layer may be formed on the intermediate layer 105, and may be partially removed to form the sacrificial layer patterns 110.

For example, the sacrificial layer may be formed using a negative-type photoresist material. An exposure mask 107 including a plurality of transmitting portions 108 may be placed over the sacrificial layer, and an exposure process may be performed through the transmitting portions 108.

Non-exposed portions of the sacrificial layer may be removed by a developing process to obtain the sacrificial layer patterns 110. The exposure process may be performed using a light source of an ultraviolet (UV)-ray or an electron beam.

The sacrificial layer patterns 110 may include a plurality of island-shaped patterns spaced apart from each other. In example embodiments, the sacrificial layer patterns 110 may be formed on some of the points of the object layer 102 at which of the holes may be formed.

The intermediate layer 105 and the sacrificial layer may be formed by at least one of, e.g., a physical vapor deposition (PVD) process, a chemical vapor deposition (CVD) process, an atomic layer deposition (ALD) process, a sputtering process and a spin coating process.

Figure 15:
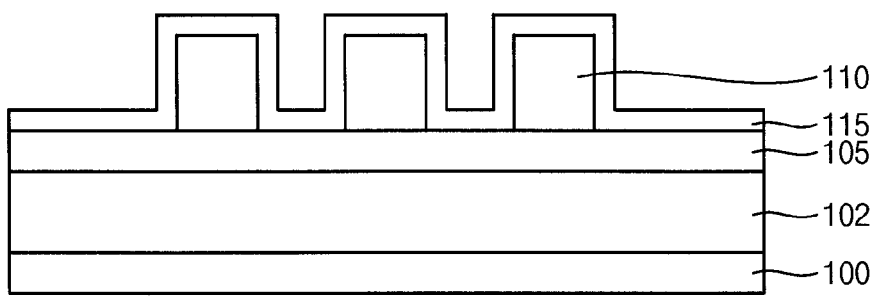

Referring to FIG. 15, a guide layer 115 may be formed along a top surface of the intermediate layer 105 and surfaces of the sacrificial layer patterns 110.

The guide layer 115 may be formed using a material and a process condition having improved step-coverage and/or conformability. For example, the guide layer 115 may be formed of a middle temperature oxide (MTO), a high temperature oxide (HTO) or an ALD oxide by an ALD process. In an embodiment, the guide layer 115 may be formed of the ALD oxide.

Figure 16:
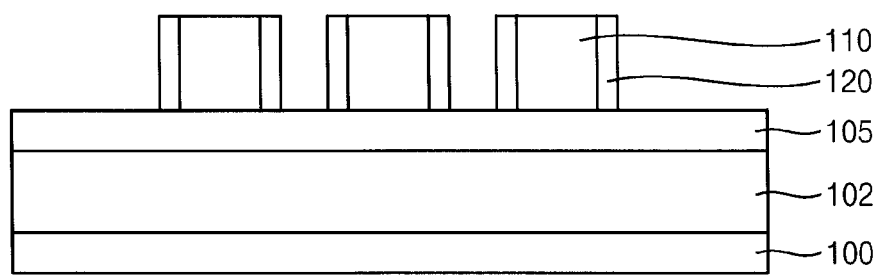

Referring to FIG. 16, the guide layer 115 may be partially removed to form guide patterns 120.

For example, the guide layer 115 may be partially removed by an etch-back process. Portions of the guide layer 115 formed on top surfaces of the sacrificial layer patterns 110 and the intermediate layer 105 may be removed by the etch-back process. Accordingly, the guide pattern 120 surrounding a sidewall of the sacrificial layer pattern 110 may be formed.

Figure 17:
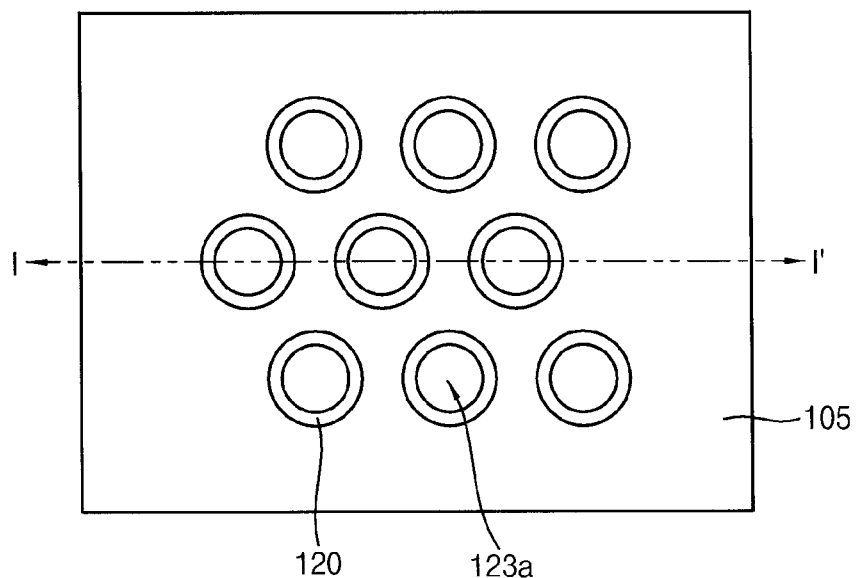
Figure 18:
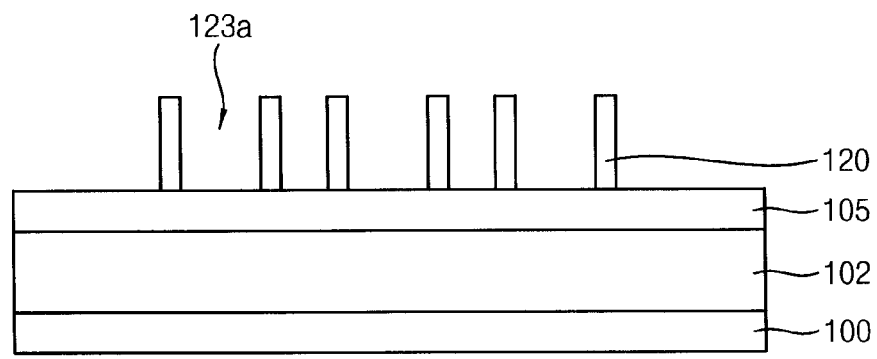

Referring to FIGS. 17 and 18, the sacrificial layer patterns 110 may be removed. For example, the sacrificial layer patterns 110 may be removed by a thinner composition having a high solubility to the photoresist material. In an embodiment, the sacrificial layer patterns 110 may be removed by an ashing process and/or a strip process.

After the removal of the sacrificial layer patterns 110, a plurality of the guide patterns 120 physically spaced apart from each other may remain on the intermediate layer 105. In example embodiments, each guide pattern 120 may have a ring shape or a hollow cylindrical shape including a first opening 123a therein. Some of the points at which the holes are formed may be exposed through the first openings 123a.

Figure 19:
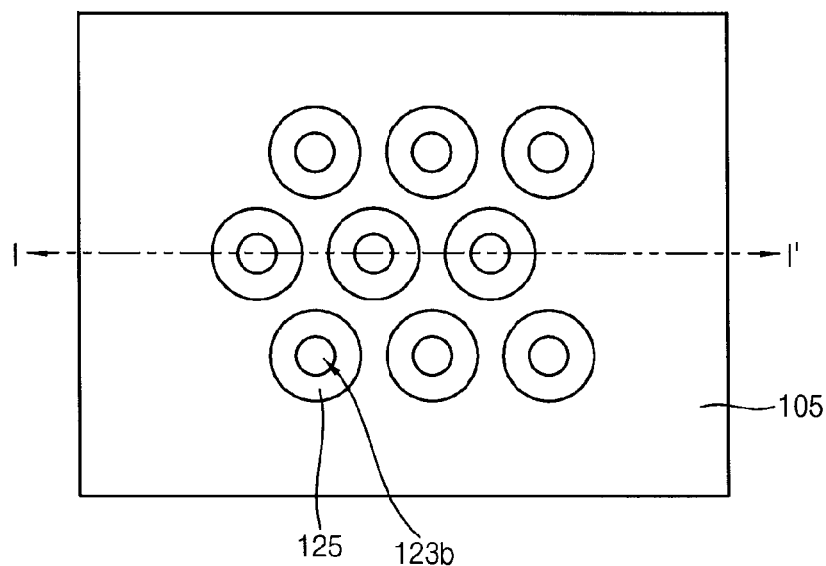
Figure 20:
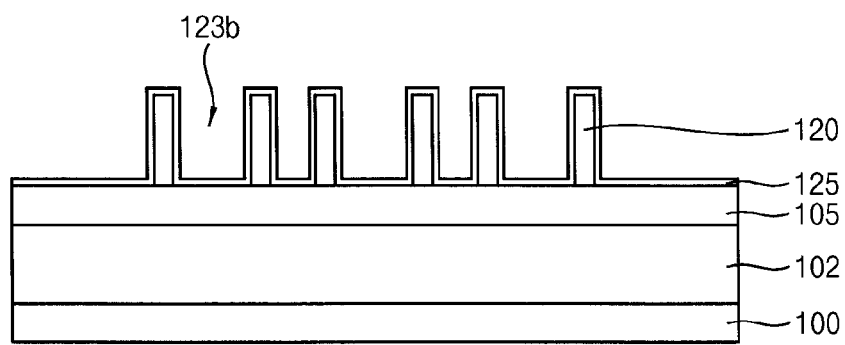

Referring to FIGS. 19 and 20, a neutral layer 125 may be formed along the top surface of the intermediate layer 105, surfaces of the guide patterns 120, and bottoms of the first openings 123a.

The neutral layer 125 may have a substantially conformal profile and have a uniform thickness. The neutral layer 125 may partially fill the first opening 123a, and thus a second opening 123b having a reduced width from a width of the first opening 123a may be defined.

In example embodiments, the neutral layer 125 may be formed using a random copolymer that may be prepared by a random co-polymerization of a first polymer unit and a second polymer unit. The first polymer unit may include, e.g., PMMA, PDMS, PVP, PEO or PI. The second polymer unit may include, e.g., PS. Accordingly, the random copolymer may be represented as PS-r-PMMA, PS-r-PDMS, PS-r-PVP, PS-r-PEO or PS-r-PI. In an embodiment, the neutral layer 125 may be formed using PS-r-PMMA.

For example, the random copolymer may be synthesized from a radical co-polymerization of the first and second polymer units, and the two different polymer units may be randomly arranged so that the random copolymer may be electrically neutral.

In example embodiments, the random copolymer may be dissolved in an organic solvent to prepare a composition. The composition may be coated on the intermediate layer 105 and the guide patterns 120 by, e.g., a spin coating process or a slit coating process. Additionally, the coated composition may be thermally cured to form the neutral layer 125.

The organic solvent may include a material having a good solubility with respect to a polymer material. For example, the organic solvent may include acetate-based, ester-based, acrylate-based or ketone-based solvents. Examples of the organic solvent may include propylene glycol monomethyl ether acetate (PGMEA), polymethacrylate (PMA) or polyglycidyl methacrylate (PGMA). These may be used alone or in a combination thereof.

In some embodiments, the formation of the neutral layer 125 may be omitted.

Figure 21:
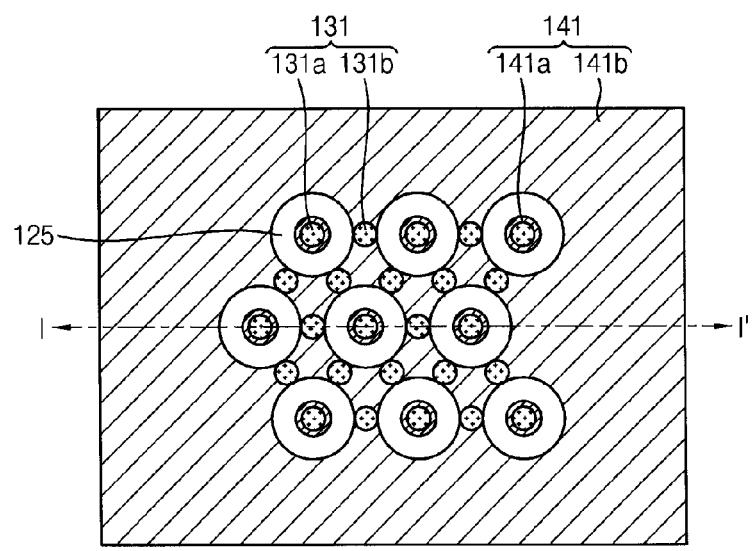
Figure 22:
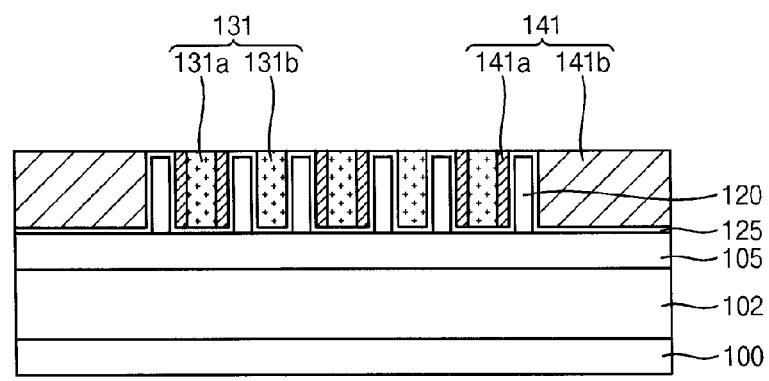

Referring to FIGS. 21 and 22, a self-aligned layer filling the second openings 123b may be formed on the neutral layer 125. The polymer units included in the self-aligned layer may be assembled into a first self-aligned pattern 131 and a second self-aligned pattern 141.

In example embodiments, the self-aligned layer may be formed using a block copolymer including two polymer units having different chemical properties. For example, the block copolymer may be prepared by a cationic polymerization or an anionic polymerization of first and second polymer units. The first polymer unit may include, e.g., PMMA, PDMS, PVP, PEO and PI, and the second polymer unit may include PS. In this case, the block copolymer unit may be represented as PS-b-PMMA, PS-b-PDMS, PS-b-PVP, PS-b-PEO and PS-b-PI. In an embodiment, the self-aligned layer may be formed using PS-b-PMMA.

For example, the block copolymer may be dissolved in an organic solvent to prepare a composition. The composition may be coated on the neutral layer 125 by, e.g., a spin coating process or a slit coating process. Additionally, the coated composition may be thermally cured by, e.g., an annealing process to form the self-aligned layer.

The organic solvent may include a solvent substantially the same as or similar to that for the formation of the neutral layer 125. For example, the organic solvent may include PGMEA, PMA, PGMA, or the like. These may be used alone or in a combination thereof.

In example embodiments, the first and second polymer units included in the self-aligned layer may be self-assembled and may be separated from each other by the second opening 123b that may be defined by the guide pattern 120 and the neutral layer 125. For example, if the self-aligned layer includes PS-b-PMMA, PMMA may be directed into the second opening 123b and self-assembled at a central portion of the second opening 123b. Accordingly, a first pillar 131a may be formed at the central portion of the second opening. PMMA may be additionally assembled between the neighboring first pillars 131a to form a second pillar 131b. Thus, a first self-aligned pattern 131 including the first and second pillars 131a and 131b may be formed by the first polymer unit.

As illustrated in FIGS. 21 and 22, the first pillar 131a and the second pillar 131b may be aligned in an arrangement substantially the same as or similar to that illustrated with reference to FIGS. 3 and 4. In some embodiments, the first and second pillars may be aligned in arrangements substantially the same as or similar to those illustrated with reference to FIGS. 1 and 2, FIGS. 5 and 6, FIGS. 7 and 8, FIGS. 9 and 10, or FIGS. 11 and 12.

Subsequently, PS may be self-assembled at a peripheral portion of the second opening 123b and on a portion of the neutral layer 125 outside the guide patterns 120 to form a second self-aligned pattern 141. The second self-aligned pattern 141 may be divided into a first portion 141a that may be formed at the peripheral portion of the second opening 123b to fill a remaining portion thereof, and a second portion 141b formed at an outside of the guide patterns 120 to be in contact with sidewalls of the second pillars 131b.

The first portion 141a may be formed in each of the second openings 123b and may have a ring shape laterally surrounding the first pillar 131a. The second portion 141b may be formed as a unitary member at the outside of the guide patterns 120.

In example embodiments, the polymer units in the block copolymer may be easily self-aligned or self-assembled by a physical difference generated from the second opening 123b.

In example embodiments, a plurality of the first self-aligned patterns 131 may be formed at the points at which the holes may be formed so that a pillar array comparable to the grid may be formed.

Figure 23:
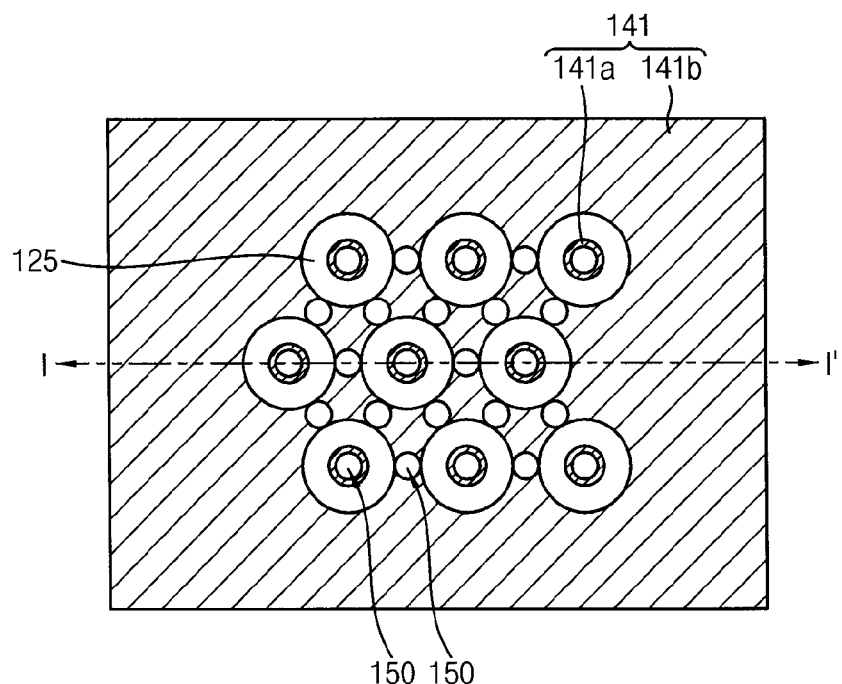
Figure 24:
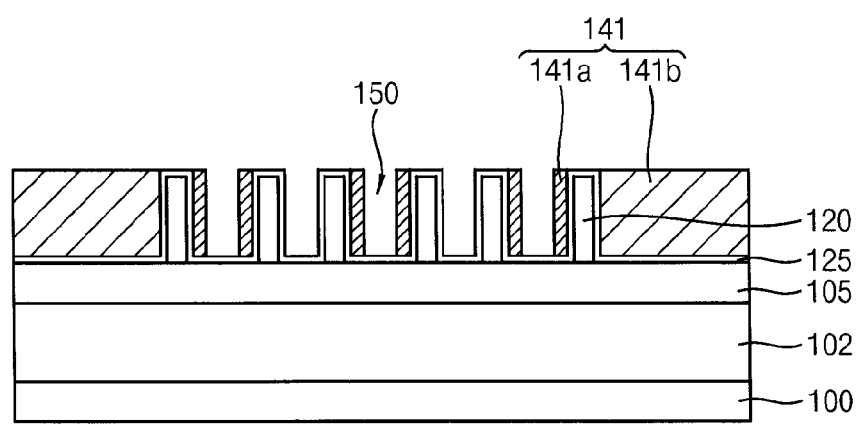

Referring to FIGS. 23 and 24, the first self-aligned pattern 131 may be selectively removed.

In example embodiments, the first self-alignment pattern 131 may be removed by a plasma etching process or a reactive ion etching (RIE) using, e.g., oxygen. The first self-aligned pattern 131 may include PMMA having a relatively strong hydrophilicity, and thus may have a relatively high affinity with respect to the plasma etching process or the RIE process. Thus, the first self-aligned patterns 131 may be selectively removed.

A preliminary hole 150 may be formed at a space from which the first self-aligned pattern 131 is removed. A preliminary hole array exposing the points at which the holes may be formed may be defined by a plurality of the preliminary holes 150.

Figure 25:
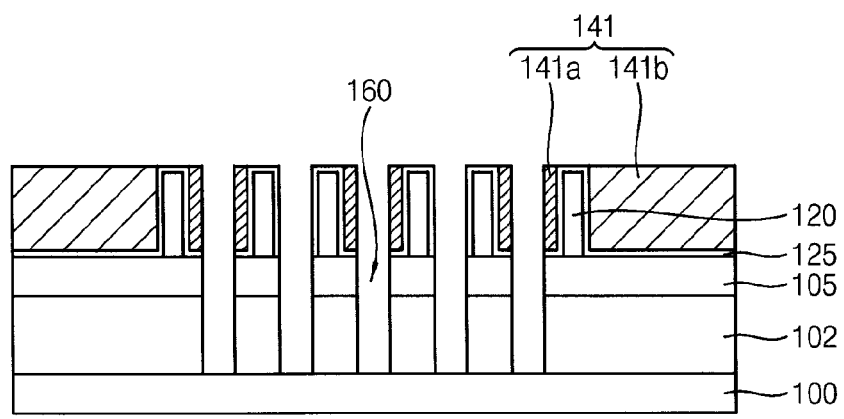

Referring to FIG. 25, the second self-aligned pattern 141 may be substantially used as an etching mask, and portions of the intermediate layer 105 and the object layer 102 exposed by the preliminary hole 150 may be removed.

In example embodiments, an etching gas or an etchant solution may be introduced through the preliminary hole 150 such that the neutral layer 125, the intermediate layer 105 and the object layer 102 may be sequentially etched. Accordingly, a hole 160 extended from the preliminary hole 150 may be formed in the object layer 102. A plurality of the holes 160 may be formed in the object layer 102 according to an arrangement of the grid.

Figure 26:
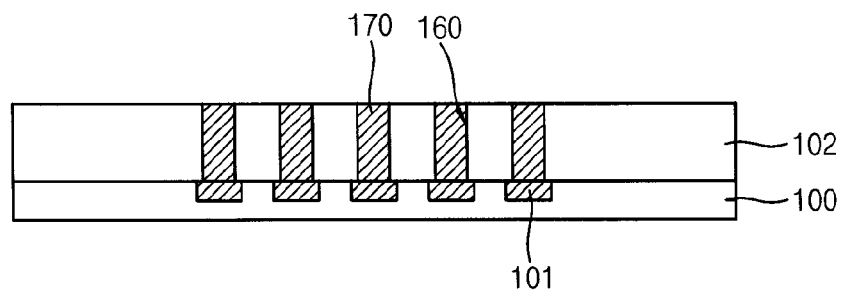

Referring to FIG. 26, the second self-aligned pattern 141, the neutral layer 125, the guide pattern 120 and the intermediate layer 105 may be removed.

For example, the second self-aligned pattern 141 and the neutral layer 125 may be removed by an ashing process and/or a strip process. Subsequently, the guide pattern 120 and the intermediate layer 105 may be removed by a chemical mechanical polish (CMP) process or an etch-back process. In some embodiments, the second self-aligned pattern 141, the neutral layer 125, the guide pattern 120 and the intermediate layer 105 may be removed together by the CMP process and/or the etch-back process.

In an embodiment, a filling structure 170 may be formed in the hole 160. For example, the filling structure 170 may serve as a conductive contact or a conductive plug. In this case, as illustrated in FIG. 26, a conductive region 101 may be formed on the substrate 100, and the filling structure 170 may be in contact with or electrically connected to the conductive region 101. The conductive region 101 may include an impurity region, a pad or a wiring.

In an embodiment, the filling structure 170 may serve as a semiconductor pattern. In this case, the filling structure 170 may include polysilicon or a single crystalline silicon, and may be in contact with the substrate 100.

For example, a conductive layer including, e.g., a metal or a metal nitride, or a semiconductor layer including, e.g., polysilicon may be formed on the substrate 100 and the object layer 102 to fill the holes 160. An upper portion of the conductive layer or the semiconductor layer may be planarized until a top surface of the object layer 102 is exposed by a CMP process to form the filling structure 170.

According to example embodiments as described above, the guide patterns 120 having a ring shape or a hollow cylindrical shape may be formed in advance at some points for predetermined holes. For example, a self-aligned pattern including PMMA may be aligned in an opening included in the guide pattern 120, and the self-aligned pattern may be expanded between the neighboring guide patterns 120. The self-aligned pattern may be removed, and then the predetermined holes may be formed by an etching process.

When the self-aligned patterns are mis-aligned, a grid distorsion may occur between a grid defined by the above-mentioned preliminary holes and a grid defined by the predetermined holes. However, according to example embodiments, the guide patterns 120 may be selectively formed at some points for the predetermined holes so that a mis-alignment of the self-aligned patterns and the grid distorsion may be avoided.

FIGS. 27 to 35 are top plan views and cross-sectional views illustrating a method of forming holes in accordance some example embodiments.

Figure 29:
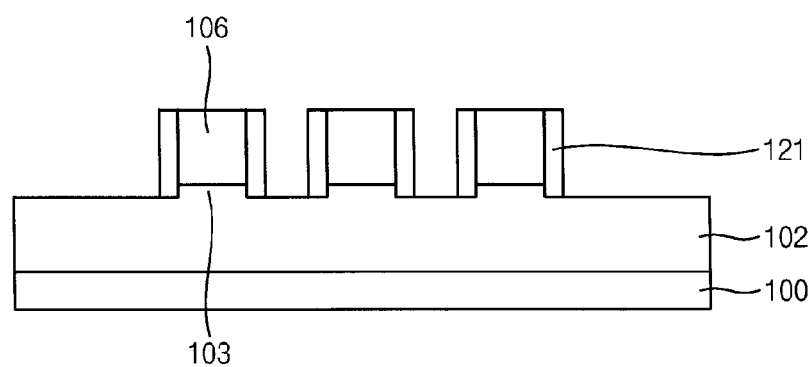
Figure 30:
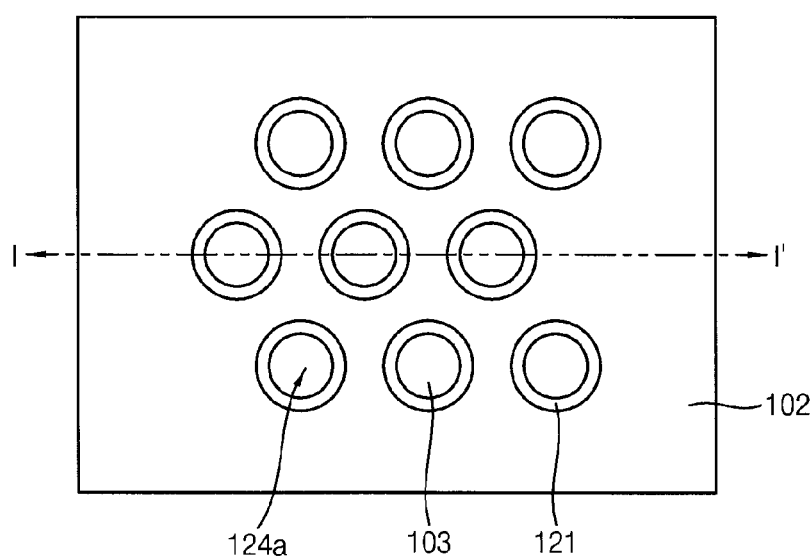
Figure 31:
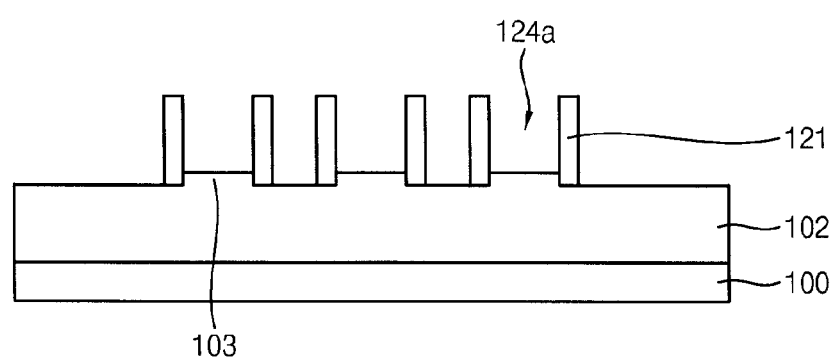
Figure 32:
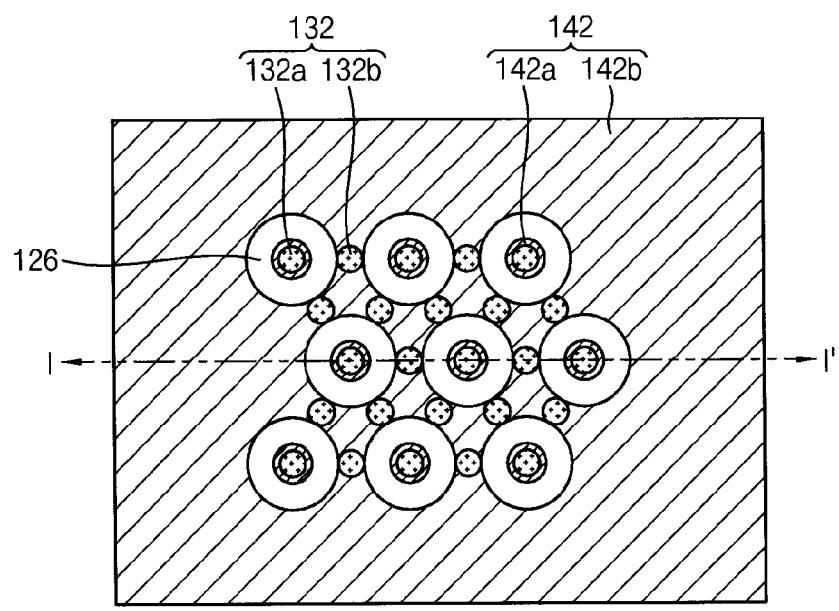

Specifically, FIGS. 30 and 32 are top plan views illustrating the method. FIGS. 27 to 29, 31, and 33 to 35 are cross-sectional views taken along a line I-I' indicated in FIGS. 30 and 32.

Detailed descriptions on processes and/or materials substantially the same as or similar to those illustrated with reference to FIGS. 13 to 26 are omitted.

Figure 27:
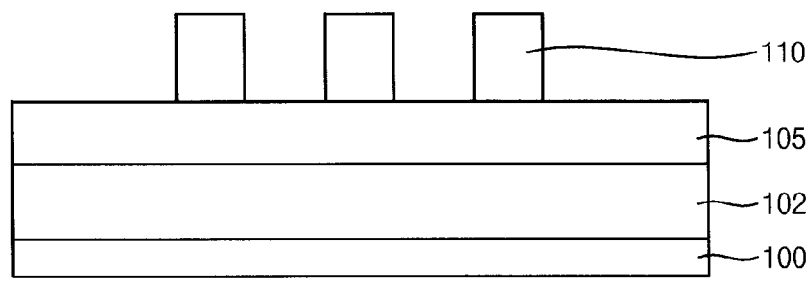
FIGS. 27 to 35 are top plan views and cross-sectional views illustrating a method of forming holes in accordance some example embodiments.

Referring to FIG. 27, a process substantially the same as or similar to that illustrated with reference to FIGS. 13 and 14 are performed.

Accordingly, an object layer 102 and an intermediate layer 105 may be sequentially formed on a substrate 100, and sacrificial layer patterns 110, each of which may have a pillar shape or a solid cylindrical shape may be formed on the intermediate layer 105.

Figure 28:
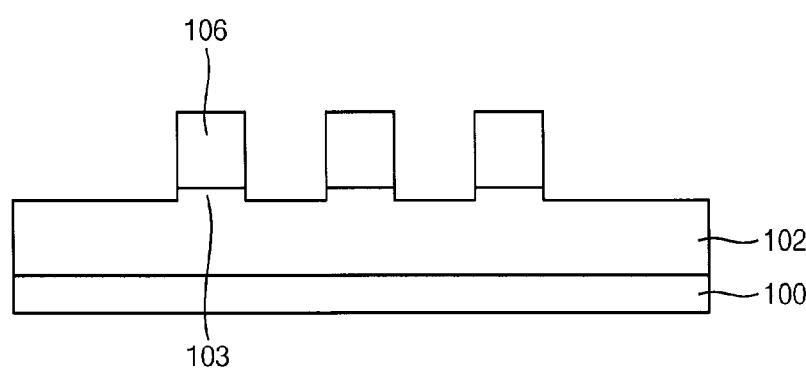

Referring to FIG. 28, the intermediate layer 105 may be partially etched using the sacrificial layer patterns 110 as an etching mask. Accordingly, intermediate layer patterns 106 having a pillar shape or a solid cylindrical shape may be formed. The intermediate layer patterns 106 may be spaced apart from each other on the object layer 102.

In example embodiments, the etching process for the intermediate layer 105 may include a dry etching process. In an embodiment, an upper portion of the object layer 102 may be also partially removed by the etching process. In this case, a stepped portion 103 protruding from a top surface of the object layer 102 may be formed under the intermediate layer pattern 106.

After the formation of the intermediate layer patterns 106, the sacrificial layer patterns 110 may be removed by, e.g., a thinner composition.

Referring to FIG. 29, processes substantially the same as or similar to those illustrated with reference to FIGS. 15 and 16 may be performed to form a guide pattern 121.

For example, a guide layer may be formed conformally on the object layer 102, sidewalls and top surfaces of the intermediate layer patterns 106, and sidewalls of the stepped portions 103. Portions of the guide layer formed on the top surfaces of the intermediate layer patterns 106 and the object layer 102 may be removed by an etch-back process. Accordingly, the guide patterns 121, each of which may have a ring shape surrounding the sidewalls of the intermediate layer pattern 106 and the stepped portion 103 may be formed.

Referring to FIGS. 30 and 31, the intermediate layer patterns 106 may be removed. Accordingly, a first opening 124a through which a top surface of the stepped portion 103 is exposed may be formed in each of the guide patterns 121.

For example, the intermediate pattern 106 may be removed by an ashing process and/or a strip process.

Figure 33:
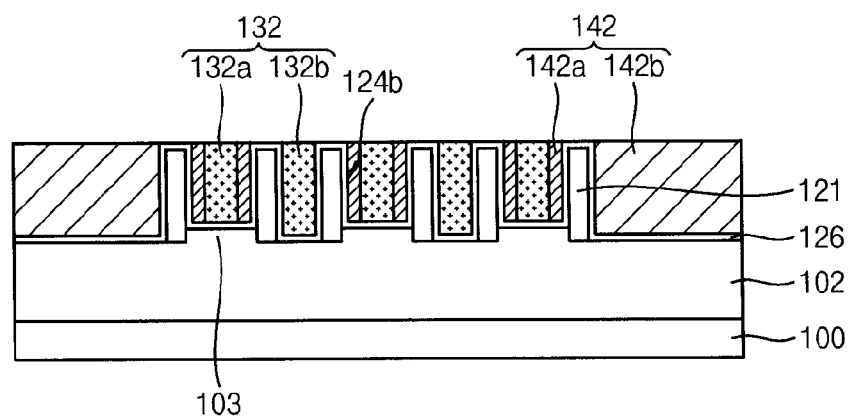

Referring to FIGS. 32 and 33, processes substantially the same as or similar to those illustrated with reference to FIGS. 19 to 22 may be performed.

Accordingly, a neutral layer 126 may be formed along the top surface of the object layer 102, surfaces of the guide patterns 121 and the top surfaces of the stepped portions 106. After the formation of the neutral layer 126, a second opening 124b having a reduced width from a width of the first opening 124a may be defined in the guide pattern 121. In some embodiments, the formation of the neutral layer 126 may be omitted.

A self-aligned layer filling the second opening 124b may be formed on the neutral layer 126. Polymer units included in the self-aligned layer may be self-assembled into a first self-aligned pattern 132 and a second self-aligned pattern 142.

The first self-aligned pattern 132 may include a first pillar 132a formed at a central portion of the second opening 124b, and a second pillar 132b formed between the neighboring guide patterns 121 or between the neighboring first pillars 132a. For example, the first self-aligned pattern 132 may include PMMA.

The second self-aligned pattern 142 may be divided into a first portion 142a formed at a peripheral portion of the second opening 124b to fill a remaining portion of the second opening 124b, and a second portion 142b formed at an outside of the guide patterns 121 and surrounding sidewalls of the second pillars 132b. For example, the second self-aligned pattern 142 may include PS.

The first and second pillars 132a and 132b of the first self-aligned pattern 132 may be aligned in arrangements substantially the same as or similar to those illustrated with reference to FIGS. 1 and 2, FIGS. 3 and 4, FIGS. 5 and 6, FIGS. 7 and 8, FIGS. 9 and 10, or FIGS. 11 and 12.

In example embodiments, a height difference between an inside and the outside of the guide pattern 120 may be generated due to the stepped portion 103, so that an additional physical difference may be caused. Thus, a self-assembly of the polymer units in the self-aligned layer may be further facilitated.

Figure 34:
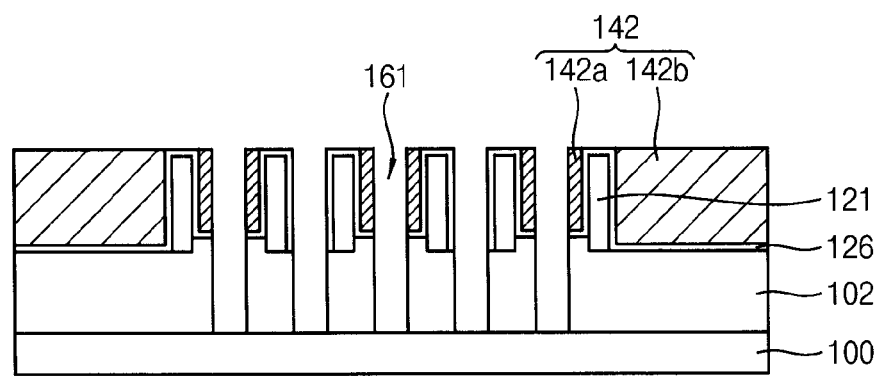

Referring to FIG. 34, processes substantially the same as or similar to those illustrated with reference to FIGS. 23 to 25 may be performed.

Accordingly, the first self-aligned pattern 132 may be selectively removed to form a preliminary hole. An etching gas or an etchant solution may be introduced through the preliminary hole such that the neutral layer 126 and the object layer 102 including the stepped portion 103 may be sequentially etched. Thus, a hole 161 extended from the preliminary hole may be formed in the object layer 102.

Figure 35:
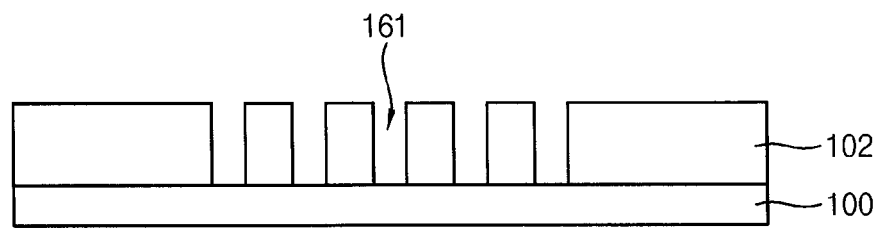

Referring to FIG. 35, the second self-aligned pattern 142, the neutral layer 126, the guide pattern 121 and the stepped portion 103 may be removed.

For example, the second self-aligned pattern 142 and the neutral layer 126 may be removed by an ashing process and/or a strip process. The guide pattern 121 and the stepped portion 103 may be removed by a CMP process or an etch-back process. Accordingly, the object layer 102 may have a substantially planar top surface.

In an embodiment, the second self-aligned pattern 142, the neutral layer 126, the guide pattern 121 and the stepped portion 103 may be removed together by the CMP process or the etch-back process.

Subsequently, a filling structure may be formed in the hole as illustrated in FIG. 26.

FIGS. 36 to 43 are top plan views and cross-sectional views illustrating a method of forming holes in accordance with some example embodiments.

Figure 36:
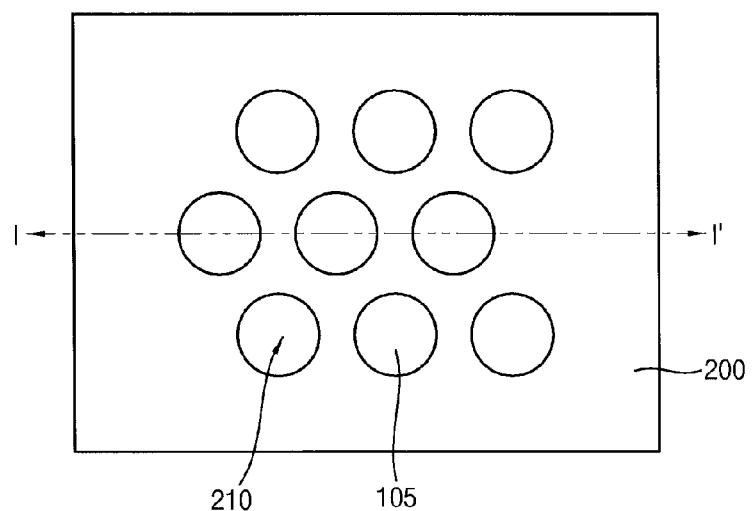
FIGS. 36 to 43 are top plan views and cross-sectional views illustrating a method of forming holes in accordance some example embodiments.
Figure 39:
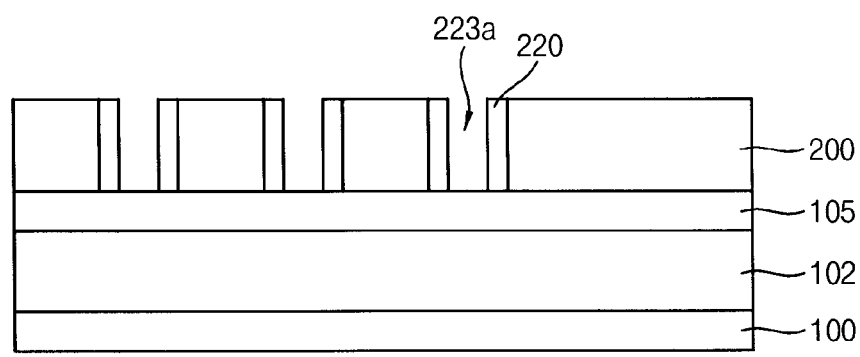
Figure 40:
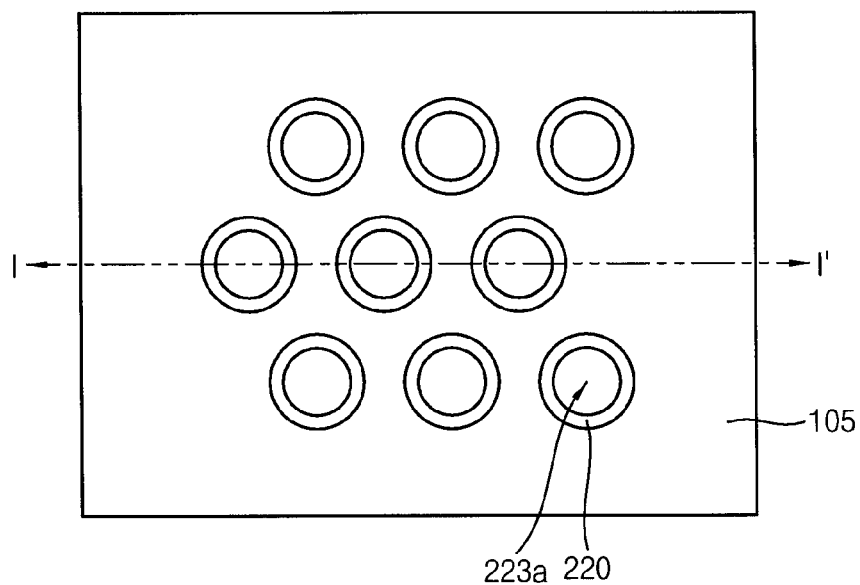
Figure 41:
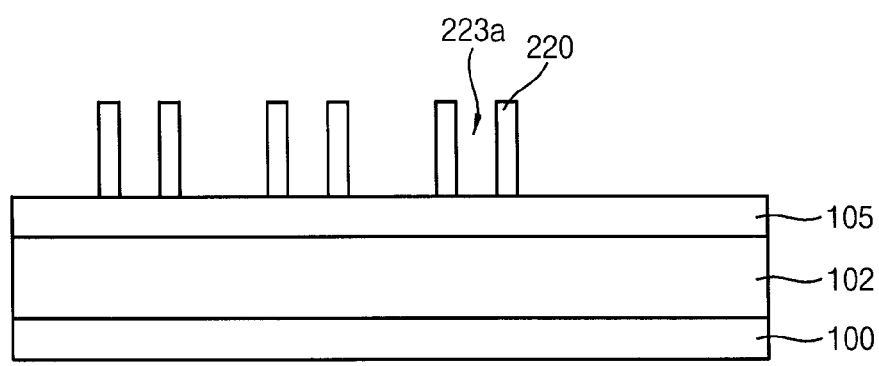
Figure 42:
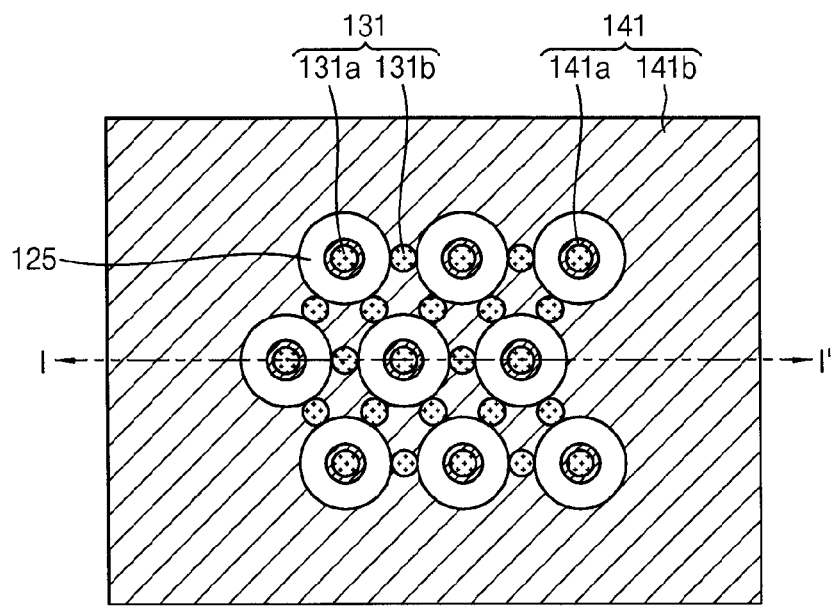

Specifically, FIGS. 36, 40 and 42 are top plan views illustrating the method. FIGS. 37 to 39, 41, and 43 are cross-sectional views taken along a line I-I' indicated in the top plan views.

Detailed descriptions on processes and/or materials substantially the same as or similar to those illustrated with reference to FIGS. 13 to 26 are omitted.

Figure 37:
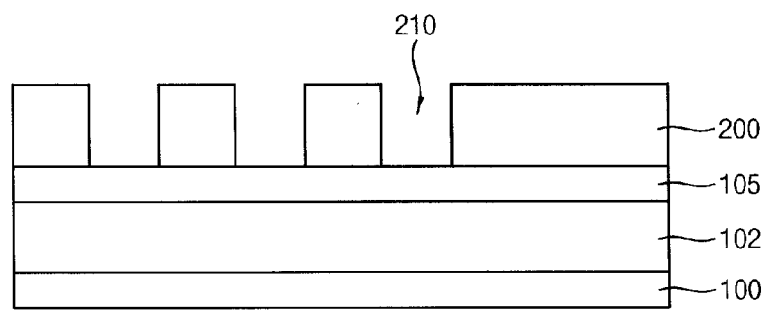

Referring to FIGS. 36 and 37, an object layer 102 and an intermediate layer 105 may be sequentially formed on a substrate 100, and a sacrificial layer pattern 200 may be formed on an intermediate layer 105.

In example embodiments, the sacrificial layer pattern 200 may include a plurality of openings 210. Some of points at which holes may be formed may be exposed through the openings 210.

For example, the sacrificial layer pattern 200 may be formed using a positive type photoresist material. For example, a photoresist layer including the photoresist material may be formed on the intermediate layer 105. An exposure process may be performed on the photoresist layer using the exposure mask 107 as illustrated in FIG. 14. Exposed portions of the photoresist layer through the transmitting portions 108 may be removed by a developing process to form the openings 210.

Figure 38:
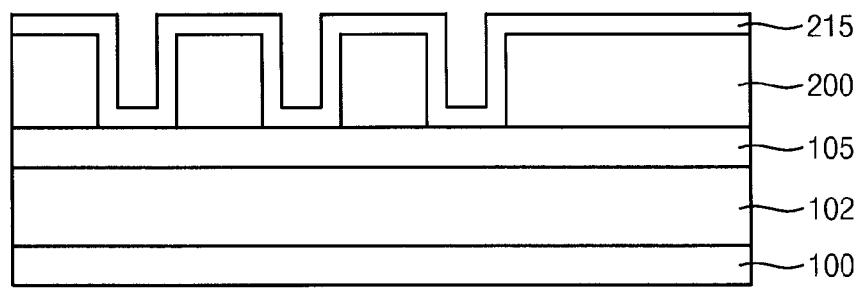

Referring to FIG. 38, a guide layer 215 may be formed along surfaces of the sacrificial layer pattern 200 and a top surface of the intermediate layer 105 exposed through the openings 210.

Referring to FIG. 39, the guide layer 215 may be partially removed to form a guide pattern 220.

In example embodiments, portions of the guide layer 215 formed on a top surface of the sacrificial layer pattern 200 and bottoms of the openings 210 may be removed by a CMP process and/or an etch-back process. Accordingly, the guide patterns 220, each of which may have a ring shape including a first opening 223a therein may be formed.

Referring to FIGS. 40 and 41, the sacrificial layer pattern 200 may be removed. For example, the sacrificial layer pattern 200 may be removed by applying a thinner composition.

Figure 43:
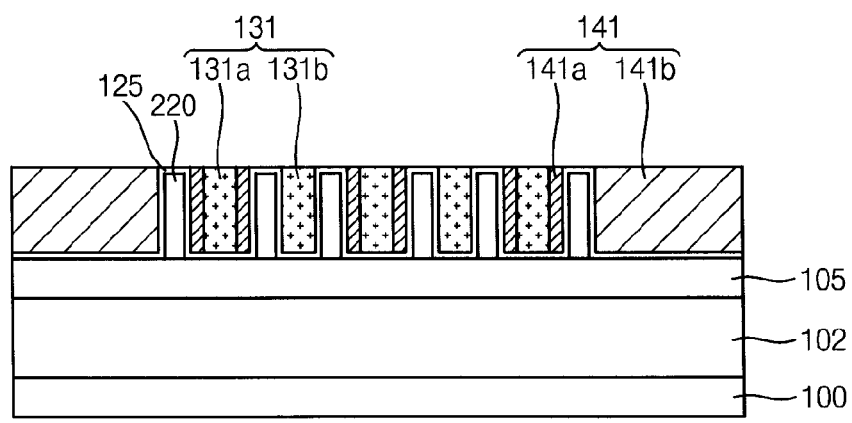

Referring to FIGS. 42 and 43, processes substantially the same as or similar to those illustrated with reference to FIGS. 19 to 22 may be performed.

Accordingly, a neutral layer 125 may be formed on the intermediate layer 105 and the guide patterns 220, and a self-aligned layer may be formed on the neutral layer 125.

A first polymer unit included in the self-aligned layer may be assembled at a central portion of the first opening 223a and between the neighboring guide patterns 220 to form a first self-aligned pattern 131. A first pillar 131a may be formed at the central portion of the first opening 223a, and a second pillar 131b may be formed between the neighboring first pillars 131a or between the neighboring guide patterns 220.

For example, the first and second pillars 131a and 131b may be aligned in arrangements substantially the same as or similar to those illustrated with reference to FIGS. 1 and 2, FIGS. 3 and 4, FIGS. 5 and 6, FIGS. 7 and 8, FIGS. 9 and 10, or FIGS. 11 and 12.

A second polymer unit included in the self-aligned layer may be aligned on a remaining portion of the neutral layer 125 after the formation of the first self-aligned pattern 131. Accordingly, a first portion 141a may be assembled at a peripheral portion of the first opening 223a, and a second portion 141b may be assembled at an outside of the guide patterns 220 such that a second self-aligned pattern 141 may be formed.

Subsequently, processes substantially the same as or similar to those illustrated with reference to FIGS. 23 to 26 may be performed. Accordingly, the first self-aligned pattern 131 may be selectively removed to form a preliminary hole. The neutral layer 125, the intermediate layer 105 and the object layer 102 may be sequentially etched through the preliminary hole. Thus, a hole extended from the preliminary hole may be formed in the object layer 102.

After the formation of the hole, the second self-aligned pattern 140, the neutral layer 125, the guide pattern 220 and the intermediate layer 105 may be removed, and a filling structure may be formed in the hole.

FIGS. 44 to 51 are top plan views and cross-sectional views illustrating a method of forming holes in accordance some example embodiments.

Figure 47:
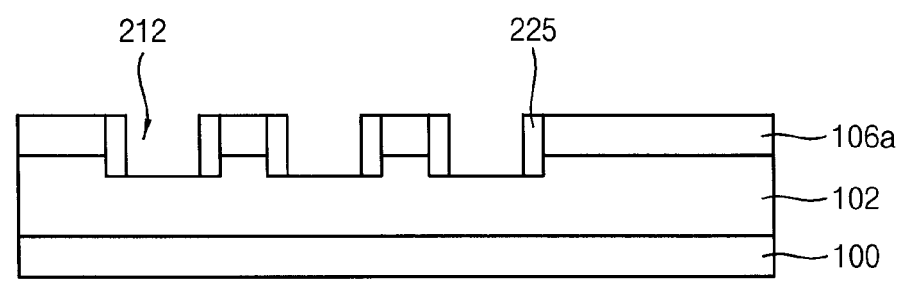
Figure 48:
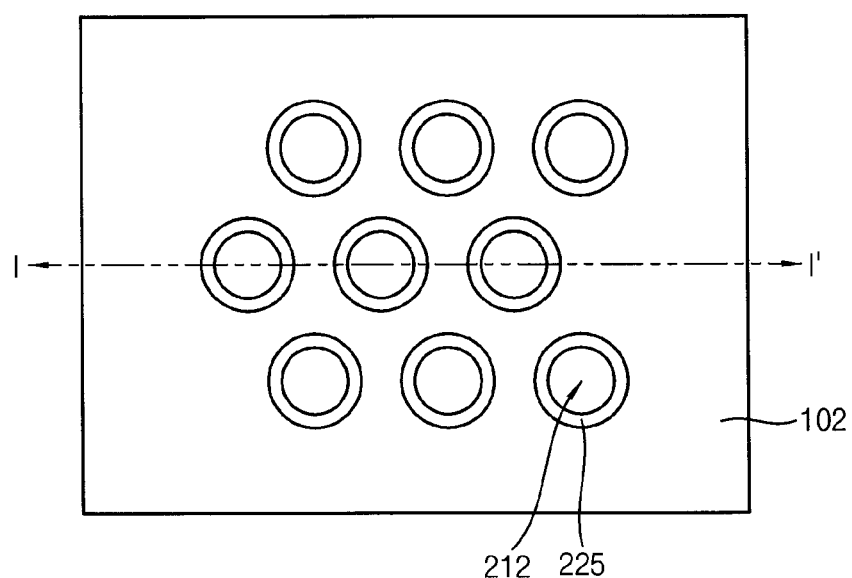
Figure 49:
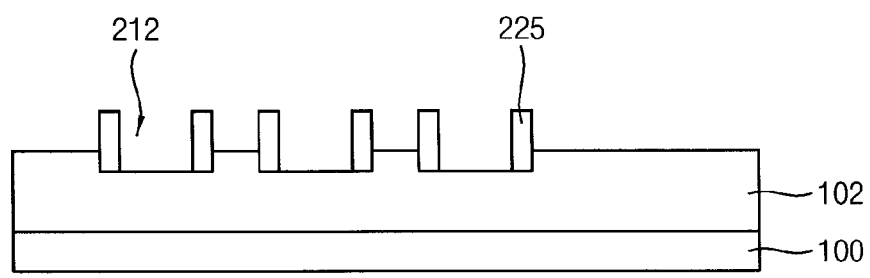
Figure 50:
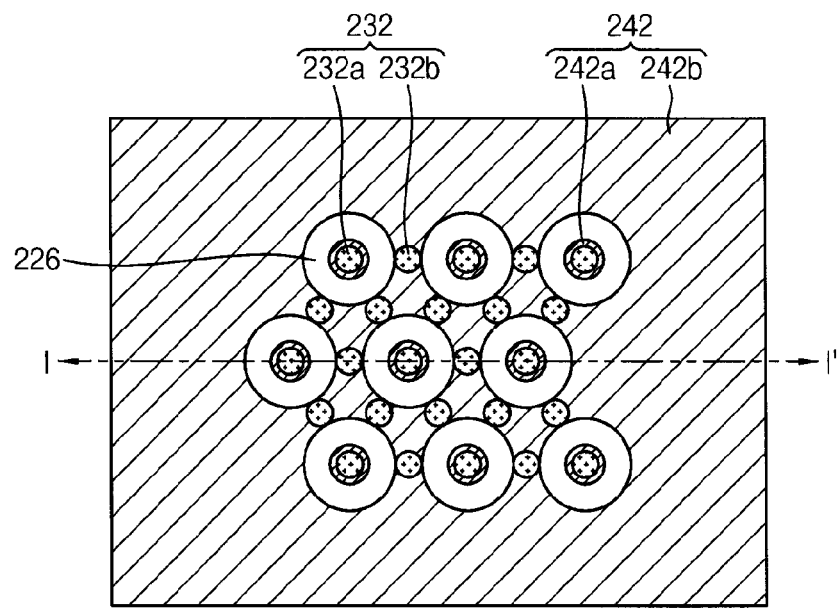

Specifically, FIGS. 48 and 50 are top plan views illustrating the method. FIGS. 44 to 47, 49 and 51 are cross-sectional views taken along a line I-I' indicated in the top plan views.

Detailed descriptions on processes and/or materials substantially the same as or similar to those illustrated with reference to FIGS. 13 to 26, FIGS. 27 to 35, or FIGS. 36 to 43 are omitted.

Figure 44:
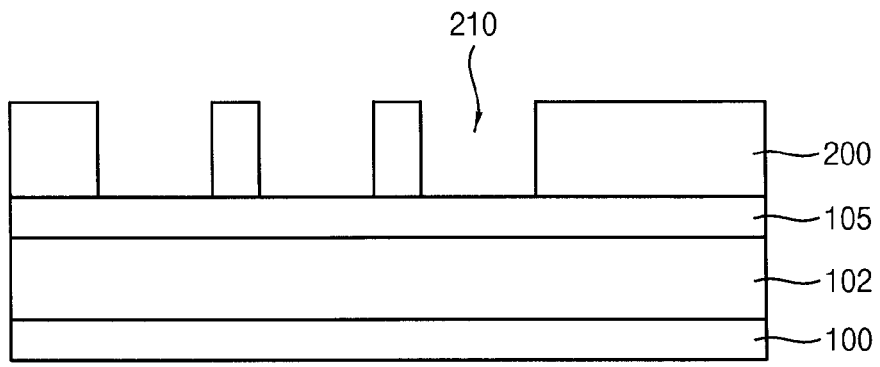
FIGS. 44 to 51 are top plan views and cross-sectional views illustrating a method of forming holes in accordance some example embodiments.

Referring to FIG. 44, process substantially the same as or similar to those illustrated with reference to FIGS. 36 and 37 may be performed.

Accordingly, an object layer 102 and an intermediate layer 105 may be sequentially formed on a substrate 100, and a sacrificial layer pattern 200 may be formed on the intermediate layer 105. The sacrificial layer pattern 200 may include a plurality of openings 210. Some points for the formation of holes in the object layer 102 may be exposed through the openings 210.

Figure 45:
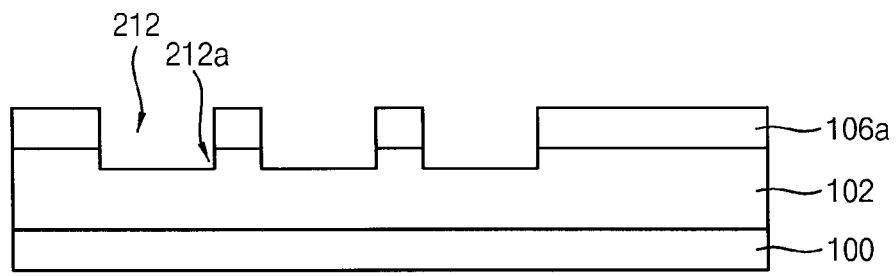

Referring to FIG. 45, portions of the intermediate layer 105 exposed by the openings 210 may be etched using the sacrificial layer pattern 200 as an etching mask. Accordingly, an intermediate layer pattern 106a including first openings 212 may be formed.

In some embodiments, an upper portion of the object layer 102 exposed by the first opening 212 may be also etched by the etching process. Accordingly, a recess 212a may be formed at the upper portion of the object layer 102 by the formation of the first opening 212. A stepped portion may be generated at the upper portion of the object layer 102 by the recess 212a.

The sacrificial layer pattern 200 may be removed by, e.g., applying a thinned composition after the formation of the intermediate layer pattern 106a.

Figure 46:
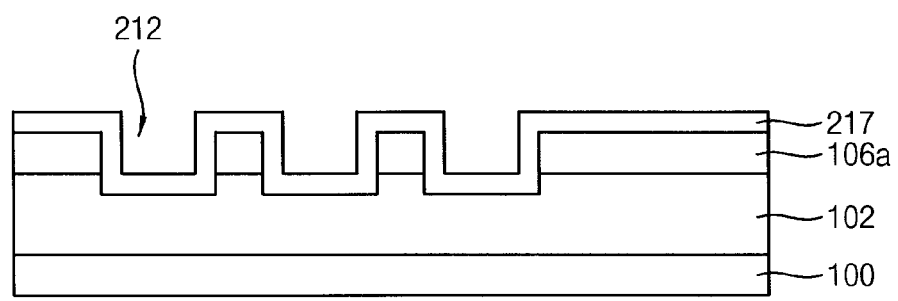

Referring to FIG. 46, a guide layer 217 may be formed conformally along a top surface of the intermediate layer pattern 106a, and an innerwall of the first opening 212.

Referring to FIG. 47, the guide layer 217 may be partially removed to form a guide pattern 225.

In example embodiments, portions of the guide layer 217 formed on the top surface of the intermediate layer pattern 106a, and bottoms of the first opening 212 or the recess 212a may be removed by a CMP process and/or an etch-back process. Accordingly, the guide patterns 225 having a ring shape and including the first opening 212 therein may be formed.

Referring to FIGS. 48 and 49, the intermediate layer pattern 106a may be removed. For example, the intermediate layer pattern 106a may be removed by an ashing process and/or a strip process.

Accordingly, the guide patterns 225 having the ring shape may be spaced apart from each other on the object layer 102. In an embodiment, the guide pattern 225 may be partially buried in the object layer 102.

Figure 51:
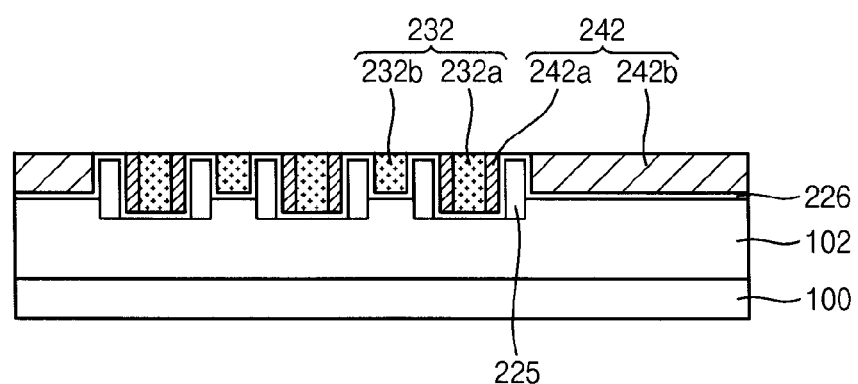

Referring to FIGS. 50 and 51, processes substantially the same as or similar to those illustrated with reference to FIGS. 19 to 22, or FIGS. 32 and 33 may be performed.

Accordingly, a neutral layer 226 may be formed on the object layer 102 and the guide pattern 225, and a self-aligned layer may be formed on the neutral layer 226.

A first polymer unit included in the self-aligned layer may be assembled at a central portion of the first opening 212 and between the neighboring guide patterns 225 to form a first self-aligned pattern 232. A first pillar 232a may be formed at the central portion of the first opening 212, and a second pillar 232b may be formed between the neighboring first pillars 232a or between the neighboring guide patterns 225.

For example, the first and second pillars 232a and 232b may be aligned in arrangements substantially the same as or similar to those illustrated with reference to FIGS. 1 and 2, FIGS. 3 and 4, FIGS. 5 and 6, FIGS. 7 and 8, FIGS. 9 and 10, or FIGS. 11 and 12.

A second polymer unit included in the self-aligned layer may be aligned on a remaining portion of the neutral layer 226 after the formation of the first self-aligned pattern 232. Accordingly, a first portion 242a may be assembled at a peripheral portion of the first opening 212, and a second portion 242b may be assembled at an outside of the guide patterns 225 such that a second self-aligned pattern 242 may be formed.

In example embodiments, a stepped portion may be generated by the recess 212a to cause an additional physical difference, so that a self-assembly of the polymer units included in the self-aligned layer may be facilitated.

Subsequently, processes substantially the same as or similar to those illustrated with reference to FIGS. 23 to 26, or FIGS. 34 and 35 may be performed. Accordingly, the first self-aligned pattern 232 may be selectively removed to form a preliminary hole. The neutral layer 226 and the object layer 102 may be sequentially etched through the preliminary hole. Thus, a hole extended from the preliminary hole may be formed in the object layer 102.

After the formation of the hole, the second self-aligned pattern 242, the neutral layer 226, and the guide pattern 225 may be removed by a CMP process, and a filling structure may be formed in the hole.

FIGS. 52 to 61 are cross-sectional views and top plan views illustrating a method of manufacturing a semiconductor device in accordance example embodiments.

Figure 52:
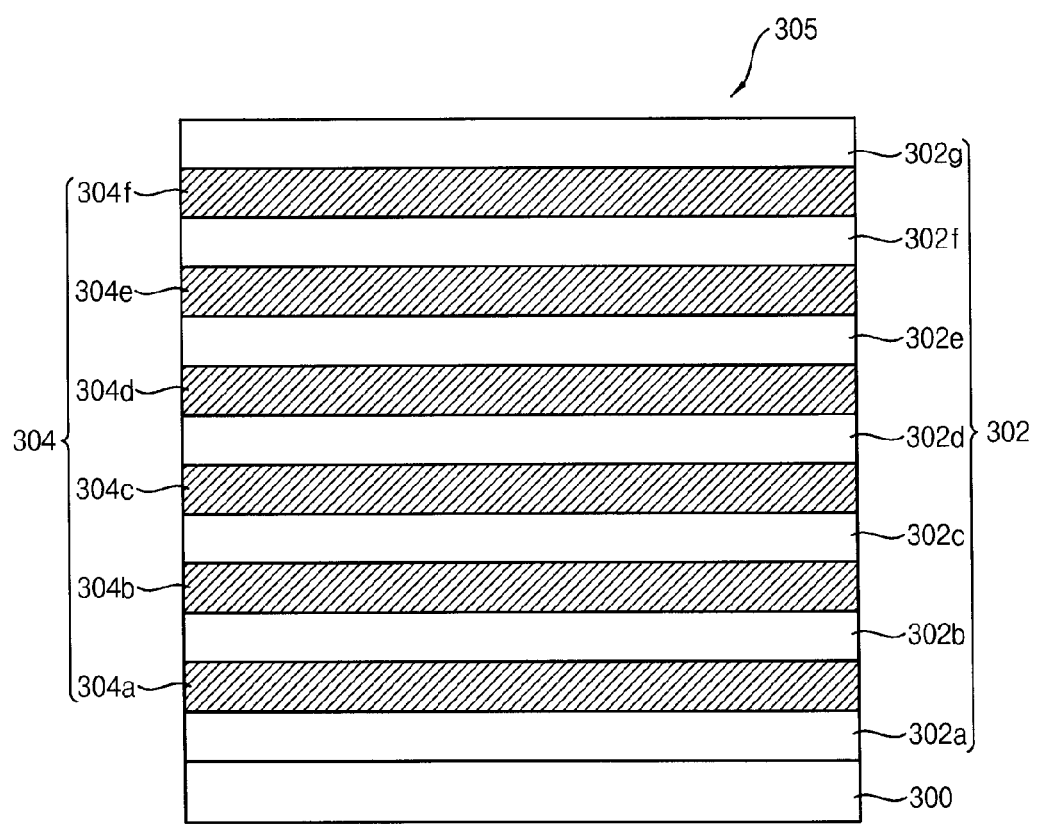
FIGS. 52 to 61 are cross-sectional views and top plan views illustrating a method of manufacturing a semiconductor device in accordance example embodiments.
Figure 52:
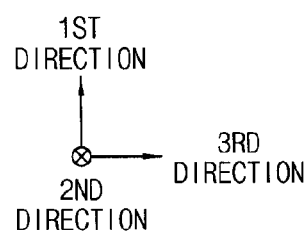
Figure 53A:
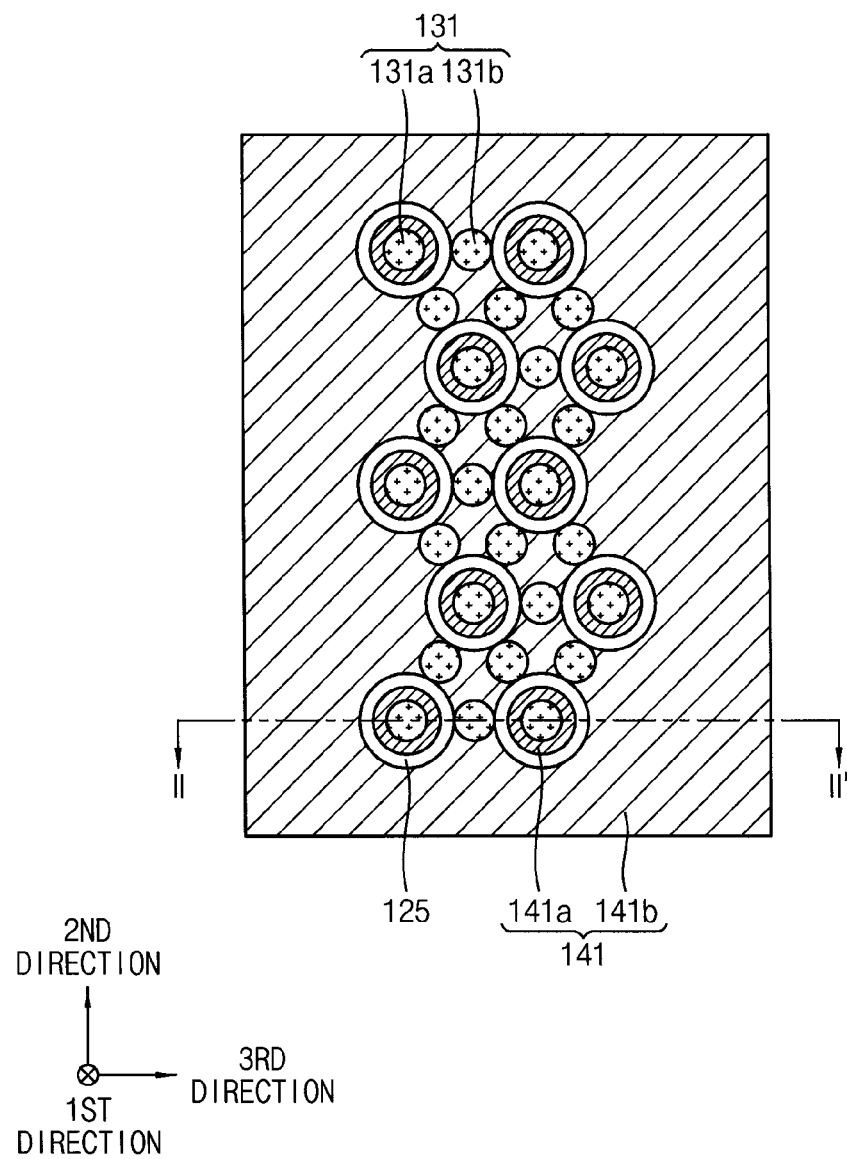
Figure 53B:
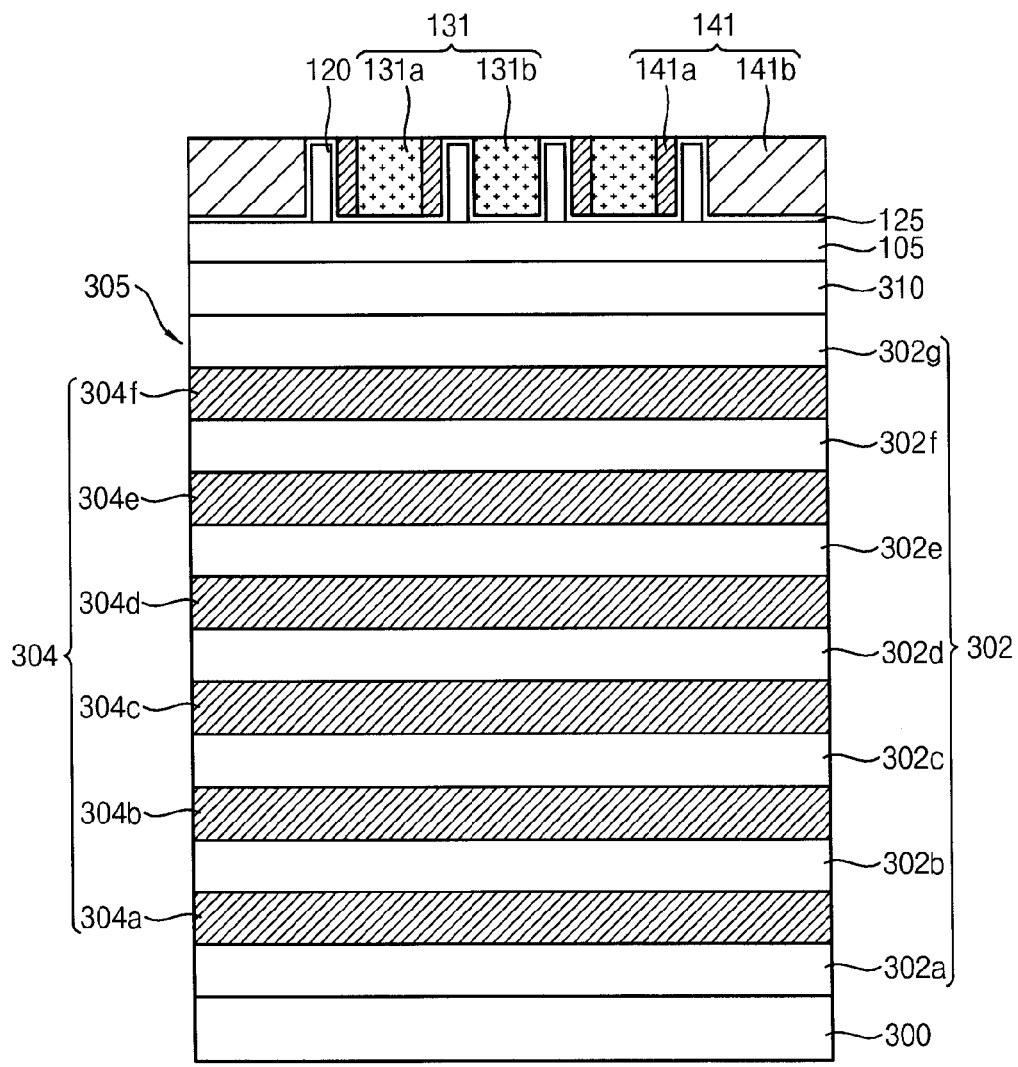
Figure 54:
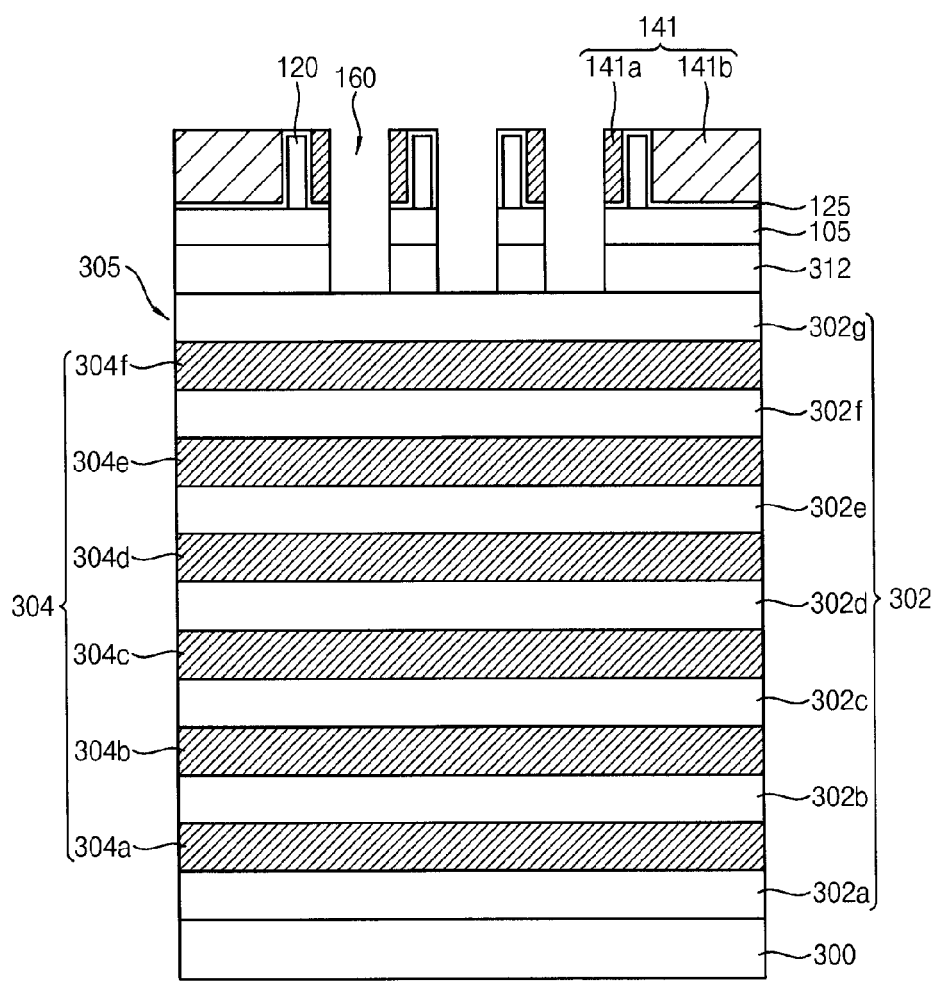
Figure 54:
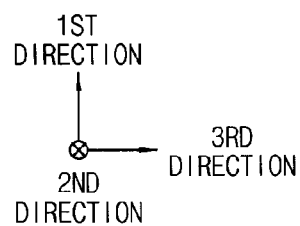
Figure 61:
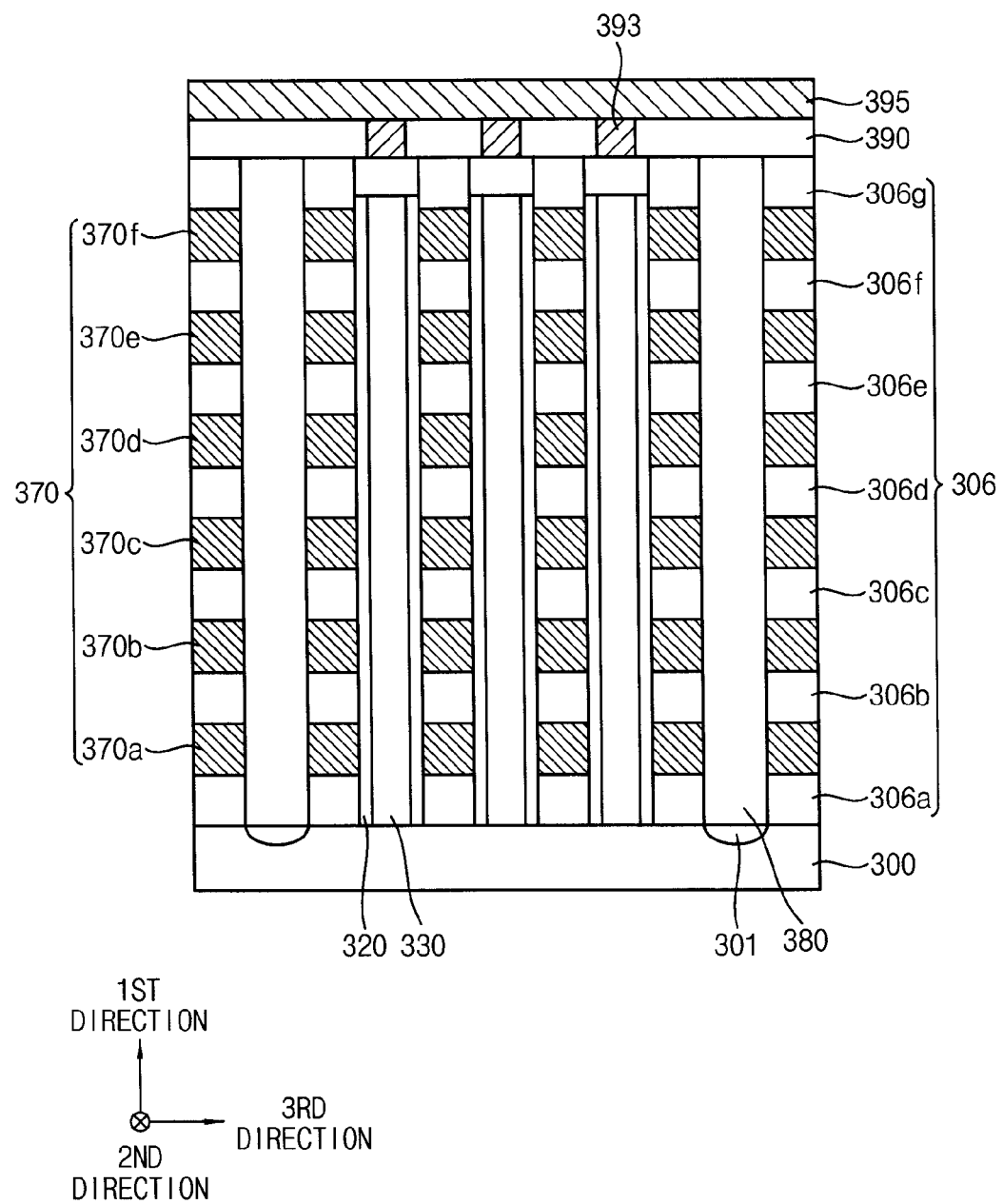

Specifically, FIGS. 52, 54, and 61 are cross-sectional views illustrating the method. FIG. 53A is a top plan view illustrating the method, and FIG. 53B is a cross-sectional view taken along a line II-II' of FIG. 53A.

For example, FIGS. 52 to 61 illustrate a method of manufacturing a vertical memory device including a vertical channel.

In FIGS. 52 to 61, a direction substantially vertical to a top surface of a substrate is referred to as a first direction, and two directions substantially parallel to the top surface of the substrate and crossing each other are referred to as a second direction and a third direction. For example, the second and third directions may be perpendicular to each other. Additionally, a direction indicated by an arrow in the figures and a reverse direction thereof are considered as the same direction.

Referring to FIG. 52, insulating interlayers 302 (e.g., 302a through 302g) and sacrificial layers 304 (e.g., 304a through 304f) may be formed alternately and repeatedly on a substrate 300 to form a mold structure.

The substrate 300 may include silicon, germanium, silicon-germanium or a group III-V compound such as GaP, GaAs, GaSb, etc. In some embodiments, the substrate 300 may be an SOI substrate or a GOI substrate.

The insulating interlayer 302 may be formed using a silicon oxide based material, e.g., silicon dioxide, silicon oxycarbide and/or silicon oxyfluoride. The sacrificial layer 304 may be formed using a material that may have an etching selectivity with respect to the insulating interlayer 302 and may be easily removed by a wet etching process. For example, the sacrificial layer 304 may be formed using a nitride-based material such as a silicon nitride and/or silicon boronitride (SiBN).

The insulating interlayer 302 and the sacrificial layer 304 may be formed by a CVD process, a plasma enhanced CVD (PECVD) process, a spin coating process, an ALD process, etc. A lowermost insulating interlayer 302a may be formed by a thermal oxidation process on the top surface of the substrate 300.

The sacrificial layers 304 may be removed in a subsequent process to provide spaces for a ground selection line (GSL), a word line and a string selection line (SSL). For example, each of the GSL and the SSL may be formed at a single level, and the word line may be formed at 4 levels. In this case, the sacrificial layers 304 may be formed at 6 levels, and the insulating interlayers 302 may be formed at 7 levels as illustrated in FIG. 52. However, the stacked number of the GSL, the SSL and the word lines may not be limited to the examples provided herein, and may be adjusted in consideration of a circuit design and/or a degree of integration of the vertical memory device.

Referring to FIGS. 53A and 53B, a hard mask layer 310 may be formed on an uppermost insulating interlayer 302g. A mask pattern structure may be formed on the hard mask layer 310 by processes substantially the same as or similar to those illustrated with reference to FIGS. 13 to 22.

Accordingly, an intermediate layer 105 may be formed on the hard mask layer 310, and a plurality of guide patterns 120 having a substantially ring shape may be formed on the intermediate layer 105. A neutral layer 125 may be formed along a top surface of the intermediate layer 105 and surfaces of the guide patterns 120, and a self-aligned layer may be formed on the neutral layer 125.

A first polymer unit including, e.g., PMMA in the self-aligned layer may be directed into an opening in the guide pattern to form a first pillar 131a. A second pillar 131b may be formed between the neighboring first pillars 131a outside the guide pattern 120. Accordingly, first self-aligned patterns 131 may be formed in an arrangement substantially the same as a grid defined by points at which channel holes 315 (see FIG. 55) may be formed.

A second polymer unit including, e.g., PS in the self-aligned layer may be directed to a peripheral portion of the opening, and an outside of the guide pattern 120 to form a second self-aligned pattern 141 including a first portion 141a and a second portion 141b.

The hard mask layer 310 may be formed using a silicon based or carbon-based SOH material.

In some embodiments, processes substantially the same as or similar to those illustrated with reference to FIGS. 27 to 35, FIGS. 36 to 43, or FIGS. 44 to 51 may be performed to form the mask pattern structure.

The mask pattern structure may have constructions substantially the same as or similar to those illustrated with reference to FIGS. 1 and 2, FIGS. 3 and 4, FIGS. 5 and 6, FIGS. 7 and 8, FIGS. 9 and 10, or FIGS. 11 and 12.

Referring to FIG. 54, processes substantially the same as or similar to those illustrated with reference to FIGS. 23 to 25 may be performed.

For example, the first self-aligned pattern 131 may be removed to form a preliminary hole. The intermediate layer 105 and the hard mask layer 310 may be etched through the preliminary hole. Accordingly, the hard mask layer 310 may be converted to a hard mask 312 including a plurality of holes 160, each of which may be extended from the preliminary hole 150.

After the formation of the hard mask 312, the second self-aligned pattern 140, the neutral layer 125, the guide pattern 120 and the intermediate layer 105 may be removed by a CMP process.

Figure 55:
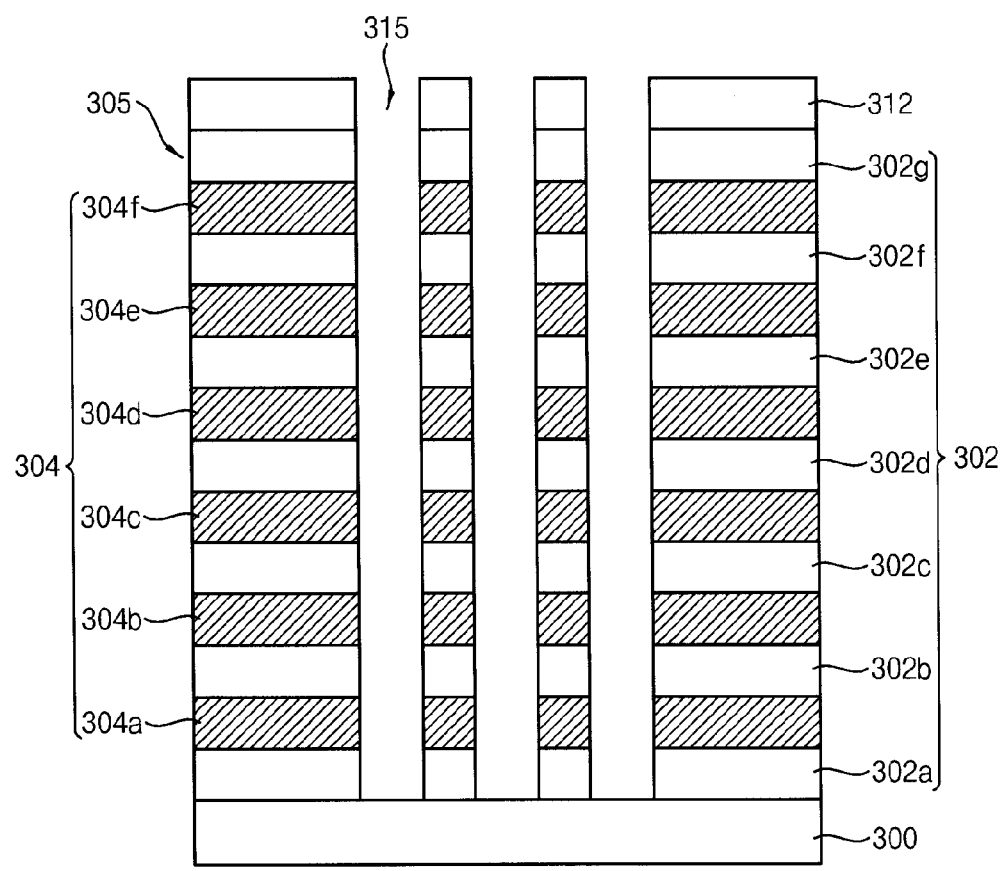
Figure 55:
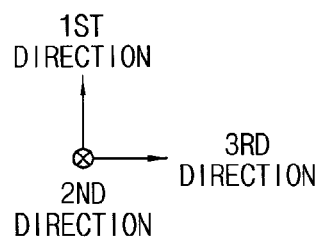

Referring to FIG. 55, the mold structure 305 may be partially etched using the hard mask 312 as the etching mask to form a channel hole 315.

For example, the insulating interlayers 302 and the sacrificial layers 304 may be partially etched by performing, e.g., a dry etching process to form the channel hole 315 through which a top surface of the substrate 300 may be partially exposed.

The channel hole 315 may have a position and a width substantially the same as those of the first self-aligned pattern 131 illustrated in FIG. 53A. For example, a plurality of the channel holes 315 may be formed in the second direction to form a channel hole row, and a plurality of the channel hole rows may be arranged in the third direction to form a channel hole grid.

In example embodiments, the guide patterns 120 having the ring shape may be formed in advance at the positions at which some of the channel holes 315 may be formed. Thus, the first self-aligned patterns 131 may be directed into the guide patterns 120 and between the neighboring guide patterns 120 to be aligned in an arrangement substantially the same as the channel hole grid. Therefore, the desired channel hole grid may be obtained without a grid distorsion even when the channel holes 315 have a fine width and a fine pitch.

The hard mask 312 may be removed by, e.g., an ashing process and/or a strip process after the formation of the channel holes 315.

Figure 56:
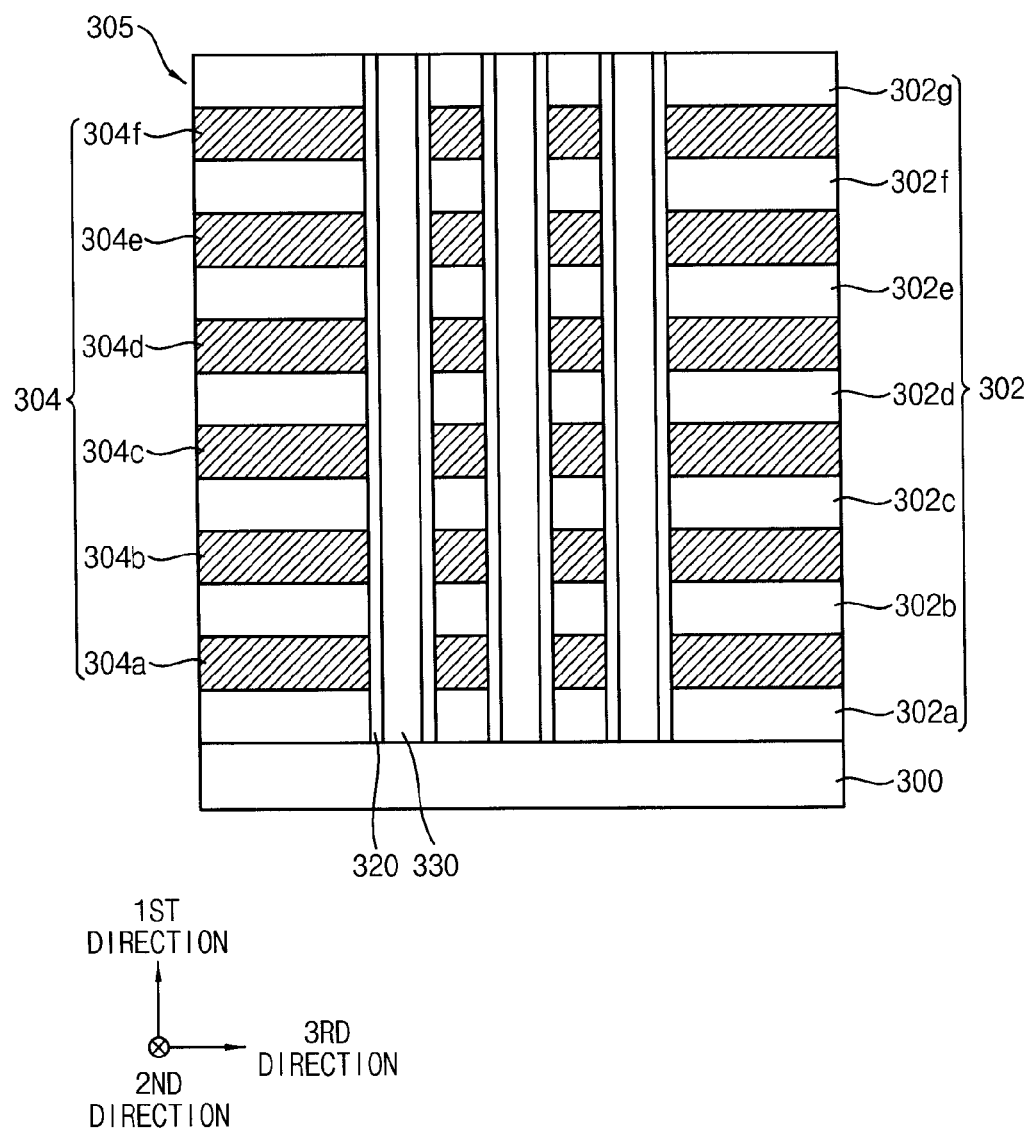

Referring to FIG. 56, a dielectric layer structure 320 and a channel 330 may be formed sequentially on a sidewall and a bottom of each channel hole 315 such that the channel hole 315 may be filled with the dielectric layer structure 320 and the channel 330.

For example, a dielectric layer may be formed on the uppermost insulating interlayer 302g, and on the sidewalls and the bottoms of the channel holes 315. The dielectric layer may be formed by sequentially stacking, e.g., a first blocking layer, a charge storage layer and a tunnel insulation layer.

For example, the first blocking layer may be formed using an oxide, e.g., silicon oxide, the charge storage layer may be formed using silicon nitride or a metal oxide, and the tunnel insulation layer may be formed using an oxide, e.g., silicon oxide. In example embodiments, the dielectric layer may be formed as an oxide-nitride-oxide (ONO) layer structure.

An etch-back process may be performed to remove portions of the dielectric layer formed on the uppermost insulating interlayer 302g and the bottoms of the channel holes 315. Accordingly, the dielectric layer structure 320 having a substantially straw shape may be formed on the sidewall of the channel hole 315.

A channel layer filling a remaining portion of the channel hole 315 may be formed on the dielectric layer structure 320 and the exposed top surface of the substrate 300. The channel layer may be planarized by a CMP process until the uppermost insulating interlayer 302g is exposed to form the channel 330.

The channel layer may be formed using polysilicon or amorphous silicon which is optionally doped with impurities. In an embodiment, a heat treatment or a laser beam irradiation may be further performed on the channel layer. In this case, the channel layer may include single crystalline silicon and defects in the channel layer. The channel 330 may have a pillar shape or a solid cylindrical shape.

In an embodiment, the channel layer may be formed conformally on an innerwall of the dielectric layer structure 320 and the top surface of the substrate 300. Subsequently, a first filling layer pattern may be formed on the channel layer to fill a remaining portion of the channel hole 315. In this case, the first filling layer pattern may have a solid cylindrical shape or a pillar shape, and the channel 330 may have a substantially cup shape. For example, the first filling layer pattern may be formed of an insulation material such as silicon oxide.

As the channel 330 is formed in each of the channel holes 315, a channel row and a channel grid comparable to the channel hole row and the channel hole grid may be formed.

Figure 57:
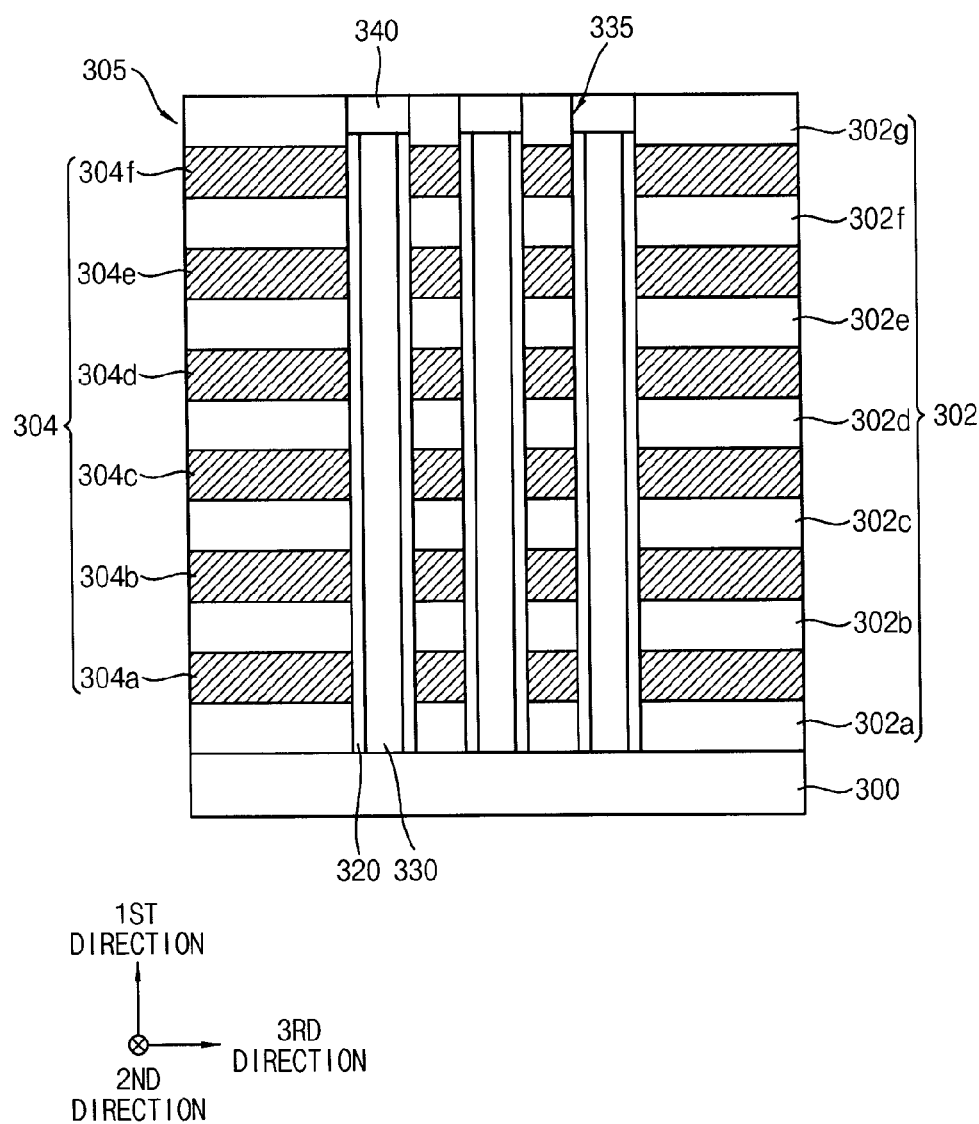

Referring to FIG. 57, a pad 340 may be formed at an upper portion of the channel hole 315.

For example, upper portions of the dielectric layer structure 320 and the channel 330 may be removed by, e.g., an etch-back process to form a recess 335. A bottom of the recess 335 may be located above a top surface of an uppermost sacrificial layer 304f. A pad layer sufficiently filling the recess 335 may be formed on the uppermost insulating interlayer 302g, and the pad layer may be planarized until a top surface of the uppermost insulating interlayer 302g is exposed to form the pad 340.

The pad layer may be formed using polysilicon optionally doped with, e.g., n-type impurities. In an embodiment, a preliminary pad layer including amorphous silicon may be formed, and then a crystallization process may be performed thereon to form the pad layer. The planarization process may include a CMP process.

Figure 58:
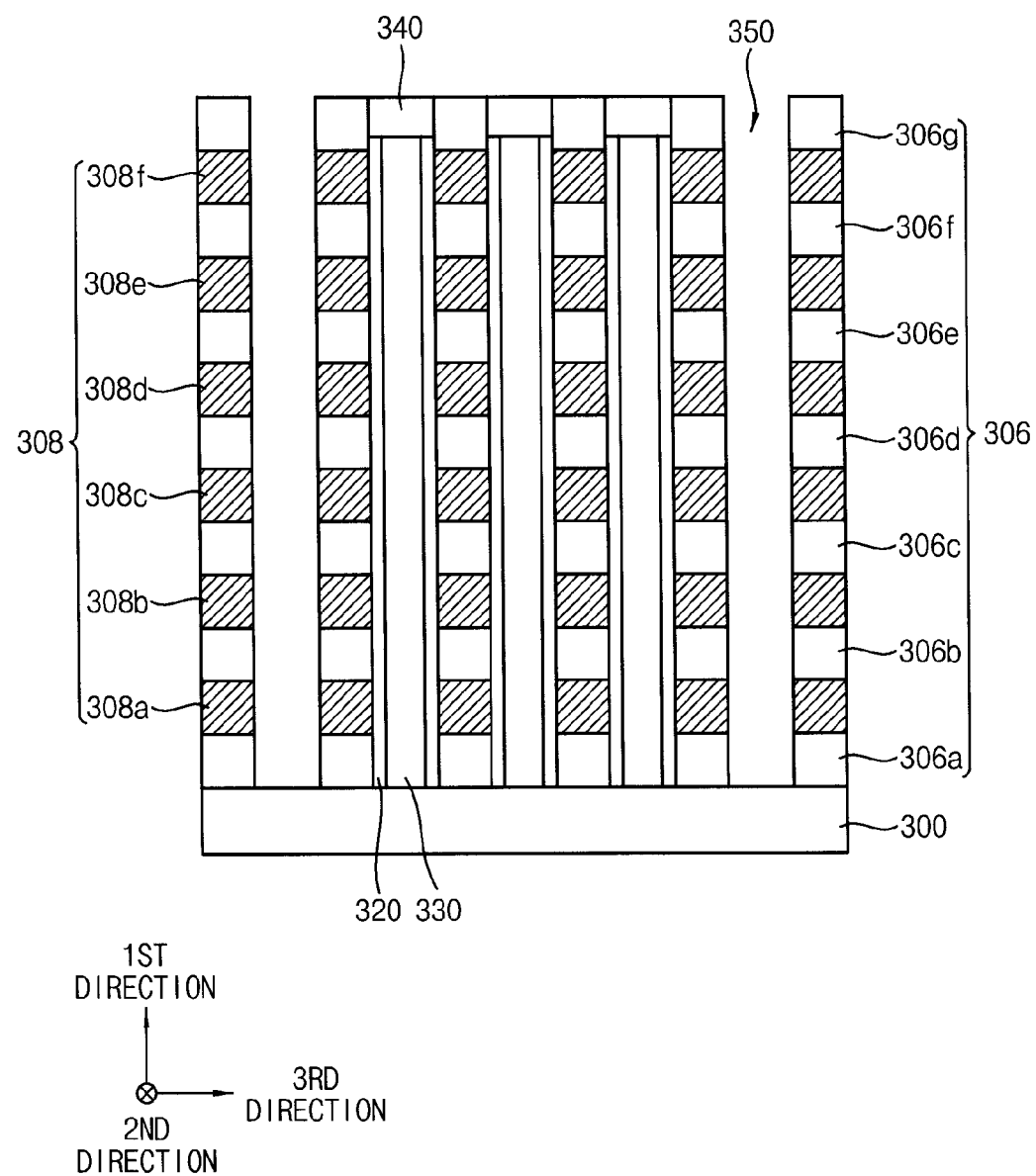

Referring to FIG. 58, a trench 350 extending through the insulating interlayers 302 and the sacrificial layers 304 may be formed.

For example, a hard mask (not illustrated) covering the pads 340 and partially exposing the uppermost insulating interlayer 302g between some of the channel rows may be formed on the uppermost insulating interlayer 302g. The insulating interlayers 302 and the sacrificial layers 304 may be partially etched by, e.g., a dry etching process using the hard mask as an etching mask to form the trench 350. The top surface of the substrate 300 may be exposed through the trench 350.

The hard mask may be formed using a photoresist material or an SOH material. The hard mask may be removed by an ashing process and/or a strip process after the formation of the trench 350.

The trench 350 may have a linear shape extending in the second direction. A plurality of the trenches 350 may be formed along the third direction. For example, the predetermined number of the channel rows may be included between the neighboring trenches 350.

By the formation of the trenches 350, the insulating interlayers 302 and the sacrificial layers 304 may be converted into insulating interlayer patterns 306 (e.g., 306a through 306g) and sacrificial layer patterns 308 (e.g., 308a through 308f). The insulating interlayer pattern 306 and the sacrificial layer pattern 308 at each level may extend in the second direction and surround the predetermined number of the channel rows.

Figure 59:
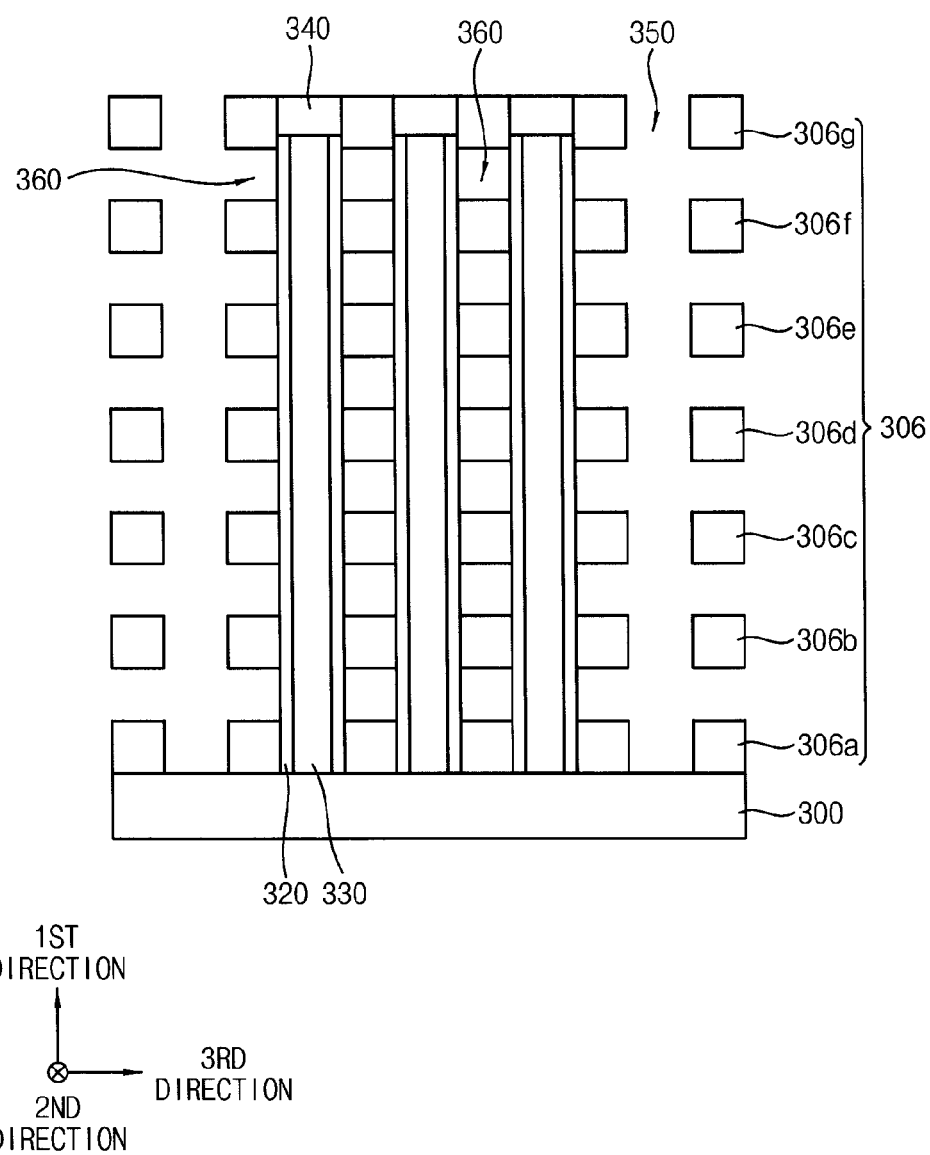

Referring to FIG. 59, the sacrificial layer patterns 308 exposed through sidewalls of the trenches 350 may be removed.

If the sacrificial layer pattern 308 includes silicon nitride, and the insulating interlayer pattern 306 includes silicon oxide, the sacrificial layer patterns 308 may be removed by a wet etching process using, e.g., phosphoric acid and/or sulfuric acid as an etchant solution that may have an etching selectivity for silicon nitride.

A gap 360 may be defined by a space from which the sacrificial layer pattern 308 is removed. A plurality of the gaps 360 may be formed along the first direction. Each gap 360 may be formed between the adjacent insulating interlayer patterns 306. An outer sidewall of the dielectric layer structure 320 may be partially exposed by the gaps 360.

Figure 60:
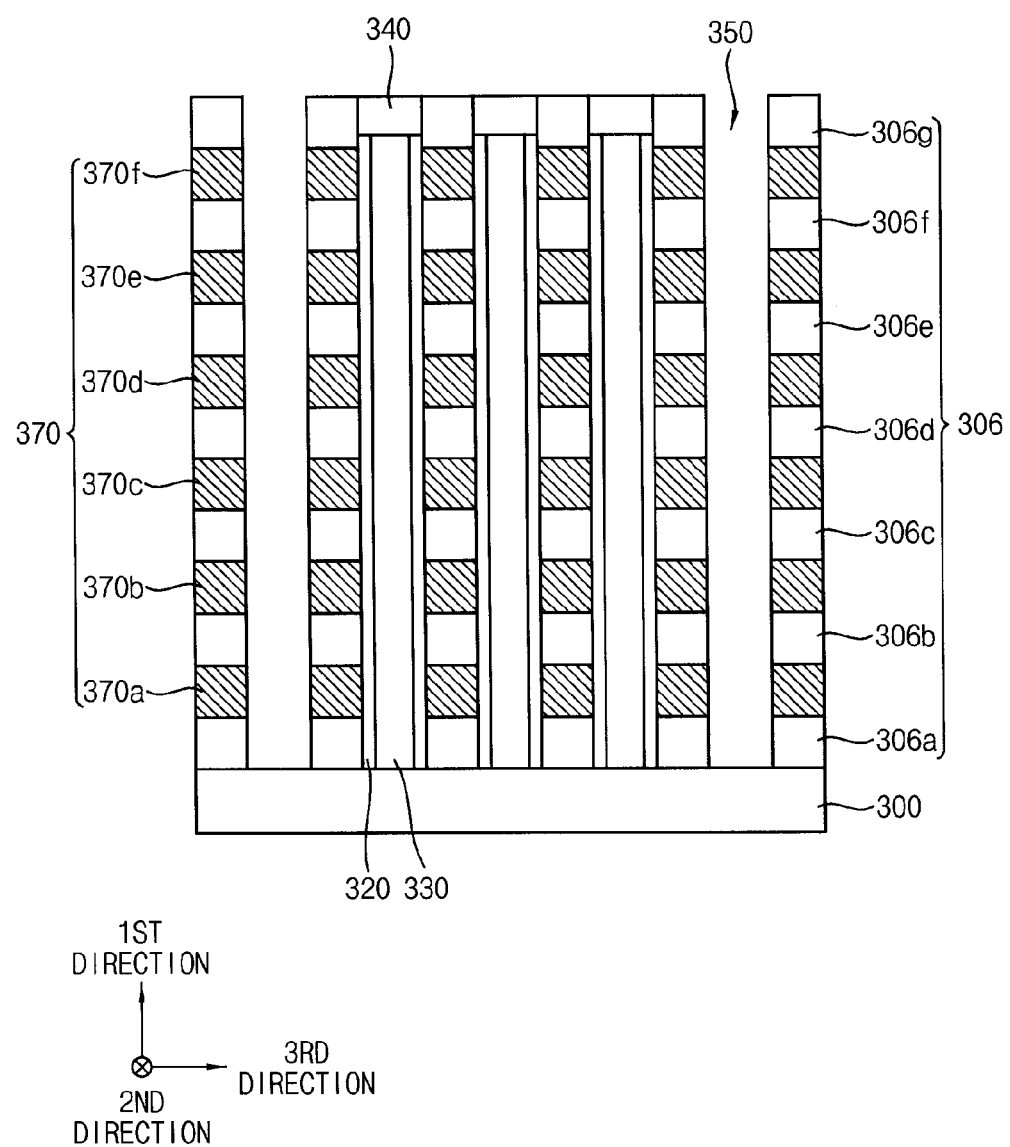

Referring to FIG. 60, a gate electrode 370 (e.g., 370a through 370o) may be formed in each gap 360.

In example embodiments, a gate electrode layer may be formed on the exposed outer sidewalls of the dielectric layer structure 320, surfaces of the insulating interlayer patterns 306, the exposed top surface of the substrate 300 and a top surface of the pad 340. The gate electrode layer may sufficiently fill the gaps 360 and at least partially fill the trench 350.

The gate electrode layer may be formed using a metal or a metal nitride having low electrical resistance and work function. For example, the gate electrode layer may be formed using tungsten, tungsten nitride, titanium, titanium nitride, tantalum, tantalum nitride, platinum, etc. In an embodiment, before the formation of the gate electrode layer, a second blocking layer may be further formed using, e.g., silicon oxide or a metal oxide.

The gate electrode layer may be partially removed to form the gate electrode 370 in the gap 360 at each level. For example, an upper portion of the gate electrode layer may be planarized by a CMP process until an uppermost insulating interlayer pattern 306g is exposed. Portions of the gate electrode layer formed in the trench 350 and on the top surface of the substrate 300 may be etched to obtain the gate electrodes 370. The gate electrode layer may be partially etched by a wet etching process using, e.g., a hydrogen peroxide-containing solution.

As illustrated in FIG. 60, a plurality of the gate electrodes 370 may be spaced apart from each other along the first direction. Each gate electrode 370 may surround outer sidewalls of the channels 330 included in the channel row and may extend linearly in the second direction.

The gate electrodes 370 may include the GSL, the word line and the SSL sequentially stacked and spaced apart from one another in the first direction. For example, a lowermost gate electrode 370a may serve as the GSL. Four gate electrodes 370b, 370c, 370d and 370e on the GSL may serve as the word lines. An uppermost gate electrode 370f on the word line may serve as the SSL. The number of the GSL, word line and the SSL is not be specifically limited herein, and may be adjusted in consideration of a circuit design and/or a degree of integration of the vertical memory device.

Referring to FIG. 61, an impurity region 301 may be formed at an upper portion of the substrate 300 exposed through the trench 350, and a second filling layer pattern 380 may be formed in the trench 350.

For example, n-type impurities such as P or As may be implanted through the trench 350 to form the impurity region 301. The impurity region 301 may serve as a common source line (CSL) extending in the second direction. In an embodiment, a metal silicide pattern (not illustrated) including, e.g., nickel silicide or cobalt silicide may be further formed on the impurity region 301 to reduce a resistance of the CSL.

A second filling layer sufficiently filling the trench 350 may be formed on the substrate 300, the uppermost insulating interlayer pattern 306g and the pad 340. An upper portion of the second filling layer may be planarized by a CMP process and/or an etch-back process until the uppermost insulating interlayer pattern 306g is exposed to form the second filling layer pattern 380. The second filling layer may be formed using an insulation material, e.g., silicon oxide.

An upper insulation layer 390 may be formed on the uppermost insulating interlayer pattern 306g, the second filling layer pattern 380 and the pad 340. The upper insulation layer 390 may be formed using an insulation material such as silicon oxide.

In an embodiment, the second filling layer may sufficiently fill the trench 350 and may cover the uppermost insulating interlayer pattern 306g and the pads 340. In this case, the formation of the upper insulation layer 390 may be omitted.

A bit line contact 393 may be formed through the upper insulation layer 390 to be in contact with the pad 340. A bit line 395 electrically connected to the bit line contact 393 may be formed on the upper insulation layer 390. The bit line contact 393 and the bit line 395 may be formed of, e.g., a metal, a metal nitride or a doped polysilicon.

A plurality of the bit line contacts 393 may be formed to correspond to the pads 340, such that a bit line contact array may be formed. The bit line 395 may be electrically connected to a plurality of the pads 340 via the bit line contacts 393, and may extend in the third direction. A plurality of the bit lines 395 may be formed along the second direction.

In an embodiment, a sub-bit line (not illustrated) may be formed to connect the predetermined number of the bit line contacts 393, and the bit line 395 may be located on the sub-bit line, and may be electrically connected to a plurality of the sub-bit lines.

FIGS. 62A, 62B, and 63 to 69 are top plan views and cross-sectional views illustrating a method of manufacturing a semiconductor device in accordance example embodiments.

Figure 62A:
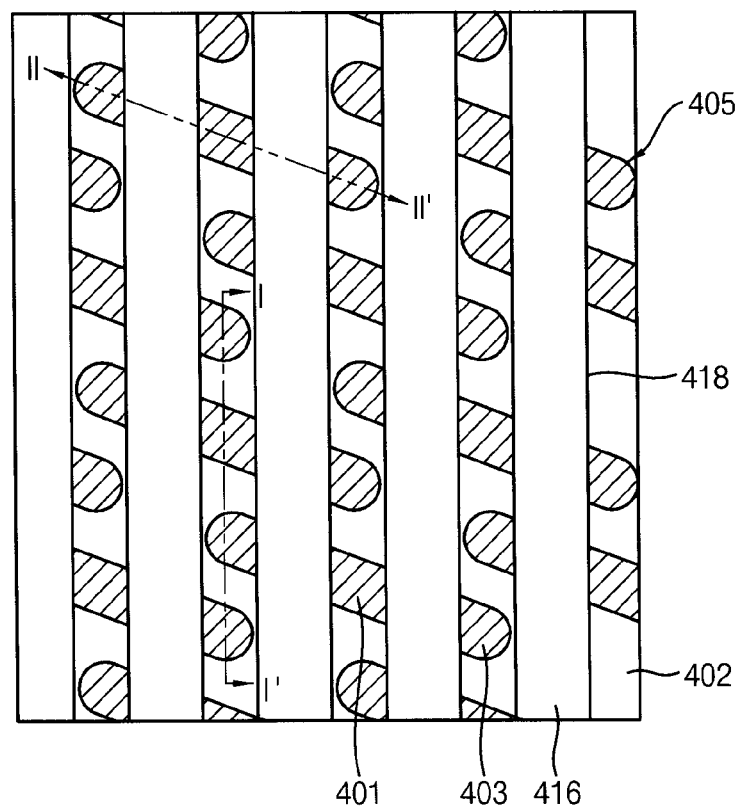
Figure 62A:
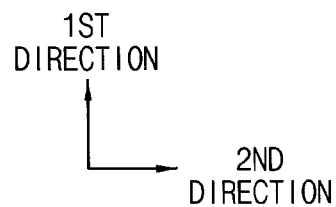
Figure 64:
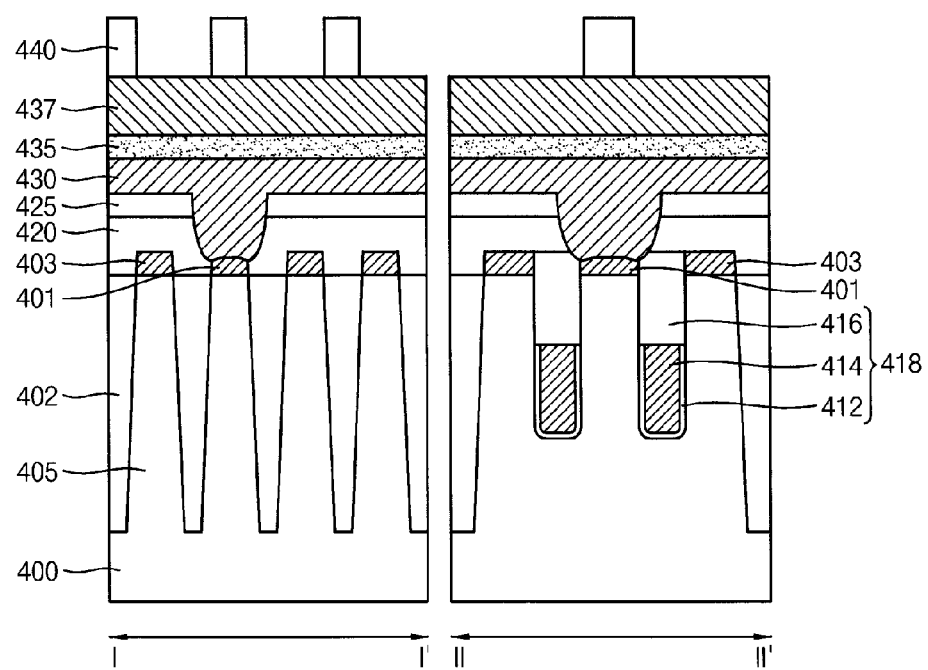
Figure 65A:
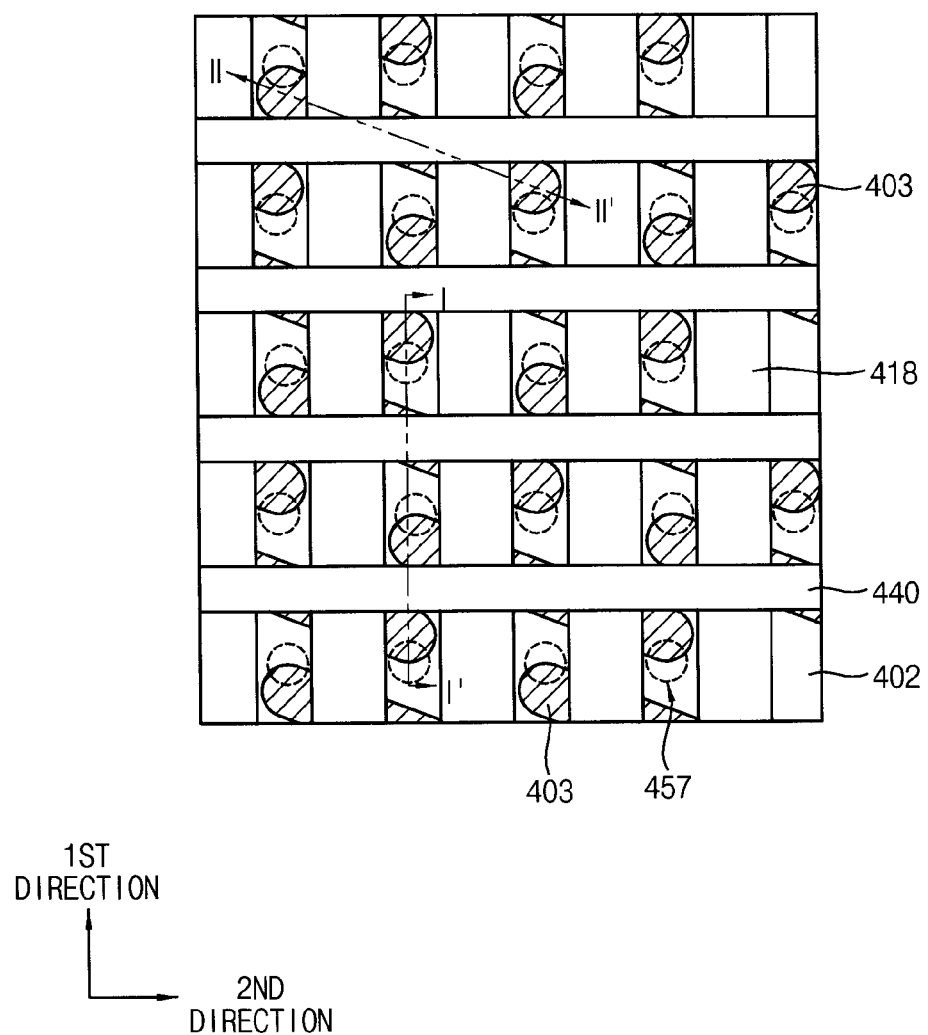

Specifically, FIGS. 62A and 65A are top plan views illustrating the methods. FIGS. 62B, 63, 64, 65B, and 66 to 69 include sub-cross sectional views taken along lines I-I' and II-II' indicated FIGS. 62A and 65A.

For example, FIGS. 62A, 62B, and 63 to 69 illustrate a method of manufacturing a semiconductor device including a buried cell array transistor (BCAT) structure.

In FIGS. 62A, 62B, and 63 to 69, two directions parallel to a top surface of a substrate and substantially perpendicular to each other are referred to as a first direction and a second direction.

Figure 62B:
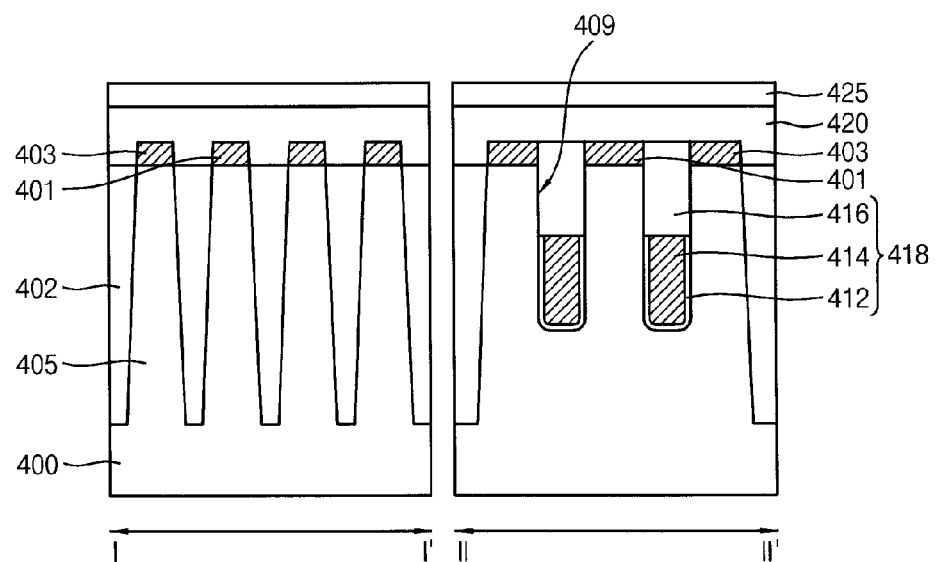

Referring to FIGS. 62A and 62B, an isolation layer 402 and an active pattern 405 may be formed on a substrate 400, and gate structures 418 extending through upper portions of the active patterns 405 may be formed.

The substrate 400 may include silicon, germanium, silicon-germanium or a group III-V compound such as GaP, GaAs, GaSb, etc. In some embodiments, the substrate 400 may be an SOI substrate or a GOI substrate.

In example embodiments, the isolation layer 402 and the active pattern 405 may be formed by a shallow trench isolation (STI) process. For example, an upper portion of the substrate 400 may be removed by an anisotropic etching process to form an isolation trench and the active patterns 405. An insulation layer filling the isolation trench may be formed on the substrate 400. The insulation layer may be planarized by, e.g., a CMP process until a top surface of the active pattern 405 is exposed to form the isolation layer 402. The isolation layer 402 may be formed of, e.g., silicon oxide.

A plurality of the active patterns 405 may be formed to be spaced apart from each other by the isolation layer 402. As illustrated in FIG. 62A, each active pattern 405 may extend in a diagonal direction to the first direction or the second direction by a predetermined angle. The plurality of the active patterns 405 may be arranged in the first and second directions.

Upper portions of the isolation layer 402 and the active patterns 405 may be etched to form gate trenches 409, and the gate structure 418 may be formed in each gate trench 409.

For example, the gate trench 409 may extend in the first direction. A plurality of the gate trenches 409 may be formed along the second direction. In some embodiments, two gate trenches 409 may be formed per each active pattern 405.

A gate insulation layer 412 and a gate electrode 414 may be formed to fill a lower portion of the gate trench 409. A gate mask 416 filling an upper portion of the gate trench 409 may be formed on the gate insulation layer 412 and the gate electrode 414.

For example, the gate insulation layer 412 may be formed by performing a thermal oxidation process on a surface of the active pattern 405 exposed by the gate trench 409. Alternatively, the gate insulation layer 412 may be formed by depositing silicon oxide or a metal oxide on the surface of the active pattern 405 by, e.g., a CVD process.

A gate conductive layer sufficiently filling the gate trench 409 may be formed on the gate insulation layer 412. The gate conductive layer may be planarized by a CMP process until the top surface of the active pattern 405 is exposed, and upper portions of the gate conductive layer and the gate insulation layer 412 formed in the gate trench 409 may be partially removed by an etch-back process. Accordingly, the gate electrode 414 filling a lower portion of the gate trench 409 may be formed on the gate insulation layer 412.

The gate conductive layer may be formed of a metal and/or a metal nitride by an ALD process or a sputtering process.

A mask layer filling a remaining portion of the gate trench 409 may be formed on the gate insulation layer 412 and the gate electrode 414, and an upper portion of the mask layer may be planarized to form the gate mask pattern 416. The mask layer may be formed of silicon nitride by, e.g., a CVD process.

Accordingly, the gate structure 418 including the gate insulation layer 412, the gate electrode 414 and the gate mask pattern 416 sequentially stacked in the gate trench 409 may be formed.

According to an arrangement of the gate trenches 409, the gate structure 418 may extend in the first direction, a plurality of the gate structures 418 may be formed along the second direction. The gate structure 418 may be buried or embedded in an upper portion of the active pattern 405. The top surface of the active pattern 405 may be divided into a central portion between two gate structures 418, and peripheral portions or end portions facing the central portion with respect to each of the gate structure 418.

An ion-implantation process may be performed to form a first impurity region 401 and a second impurity region 403 at portions of the active pattern 405 adjacent to the gate structures 418. For example, the first impurity region 401 may be formed at the central portion of the active pattern 405, and the second impurity region 403 may be formed at the peripheral portion (e.g., at both ends) of the active pattern 405.

In some embodiments, as illustrated in FIG. 62B, an upper portion of an isolation layer 402 may be partially removed by an etch-back process such that the upper portion of the active pattern 405 may be exposed, and then the impurity regions 401 and 403 may be formed.

A capping layer 420 covering the active pattern 405 and the isolation layer 402 may be formed, and a first insulating interlayer 425 may be formed on the capping layer 420. For example, the capping layer 420 and the first insulating interlayer 425 may be formed of silicon nitride and silicon oxide, respectively. The capping layer 420 may substantially serve as an etch-stop layer in subsequent processes.

Figure 63:
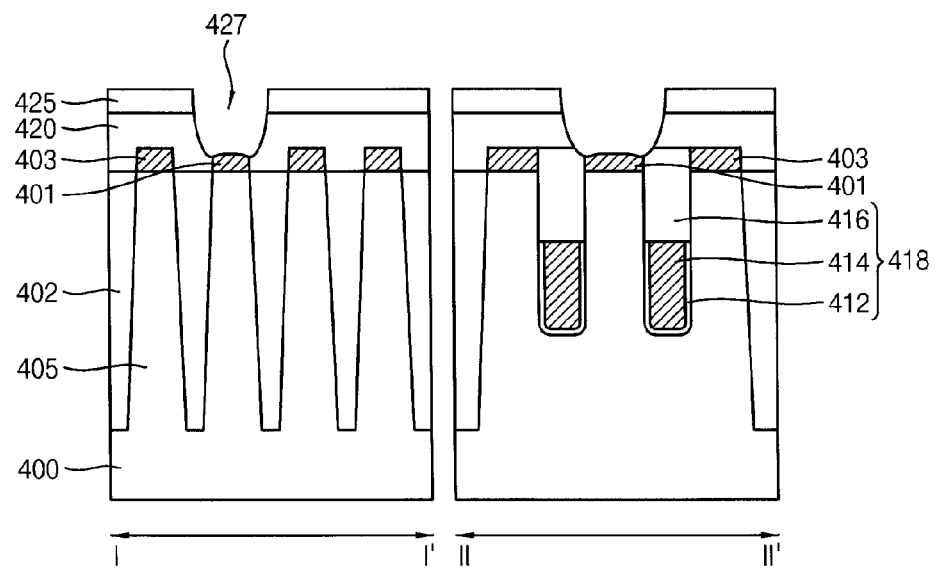

Referring to FIG. 63, the first insulating interlayer 425 and the capping layer 420 may be sequentially and partially etched to form a groove 427 through which the first impurity region 401 may be exposed. The groove 427 may extend in the second direction indicated in FIG. 62A, and a plurality of the grooves 427 may be formed along the first direction.

In some embodiments, the first impurity region 401 may be also partially removed by the etching process. Accordingly, a height difference between the first and second impurity regions 401 and 403 may be generated, and thus a bridge or a short circuit between a conductive line structure 445 and a conductive contact 465 (see FIG. 69) formed by subsequent processes may be prevented.

Referring to FIG. 64, a first conductive layer 430 filling the groove 427 may be formed on the first insulating interlayer 425. A barrier conductive layer 435 and a second conductive layer 437 may be sequentially formed on the first conductive layer 430, and a mask pattern 440 may be formed on the second conductive layer 437.

For example, the first conductive layer 430 may be formed using doped polysilicon, the barrier conductive layer 435 may be formed of a metal nitride or a metal silicide, and the second conductive layer 437 may be formed using a metal. The first conductive layer 430, the barrier conductive layer 435 and the second conductive layer 437 may be formed by, e.g., a sputtering process, a PVD process or an ALD process.

The mask pattern 440 may include, e.g., silicon nitride, and may extend linearly in the second direction. A width of the mask pattern 440 may be smaller than that of the groove 427.

Figure 65B:
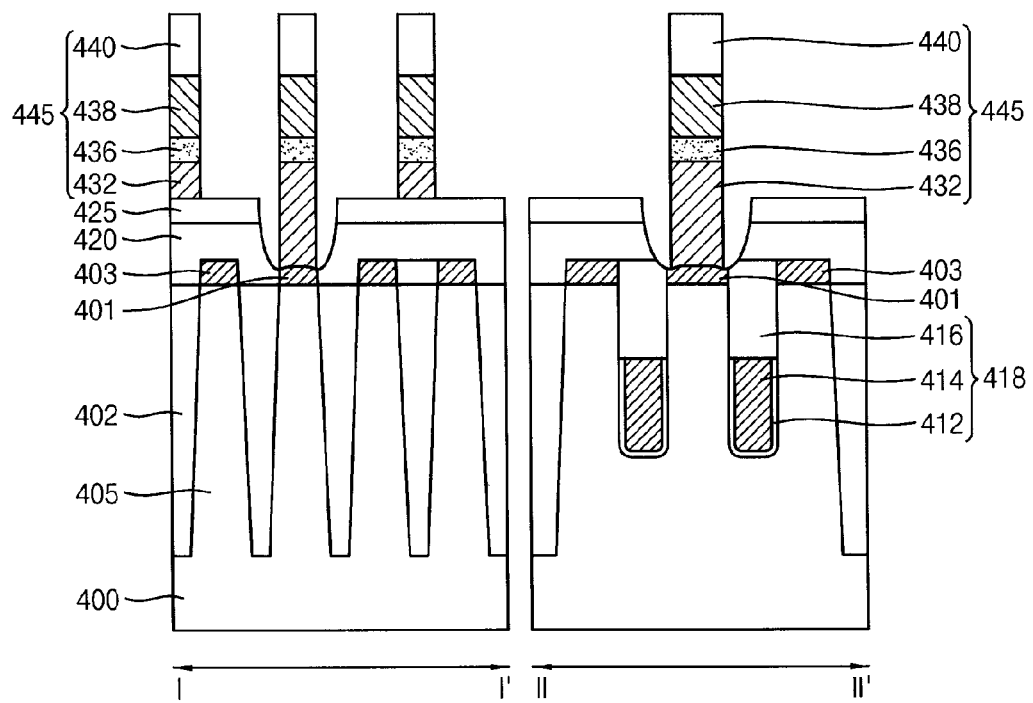

Referring to FIGS. 65A and 65B, the second conductive layer 437, the barrier conductive layer 435 and the first conductive layer 430 may be sequentially etched using the mask pattern 440 as an etching mask. Accordingly, a first conductive layer pattern 432, a barrier conductive layer pattern 436 and a second conductive layer pattern 438 may be sequentially formed on the first impurity region 401. For convenience of descriptions, an illustration of the first insulating interlayer 425 and the capping layer 420 is omitted in FIG. 65A.

Accordingly, the conductive line structure 445 extending in the second direction and including the first conductive layer pattern 432, the barrier conductive layer pattern 436 and the second conductive layer pattern 438 and the mask pattern 440 may be formed on the first impurity region 401. In example embodiments, the conductive line structure 445 may serve as a bit line.

In some embodiments, the conductive line structure 445 may have a narrower width than that of the groove 427. Thus, a sidewall of the conductive line structure 445 may be spaced apart form a sidewall of the groove 427.

Figure 66:
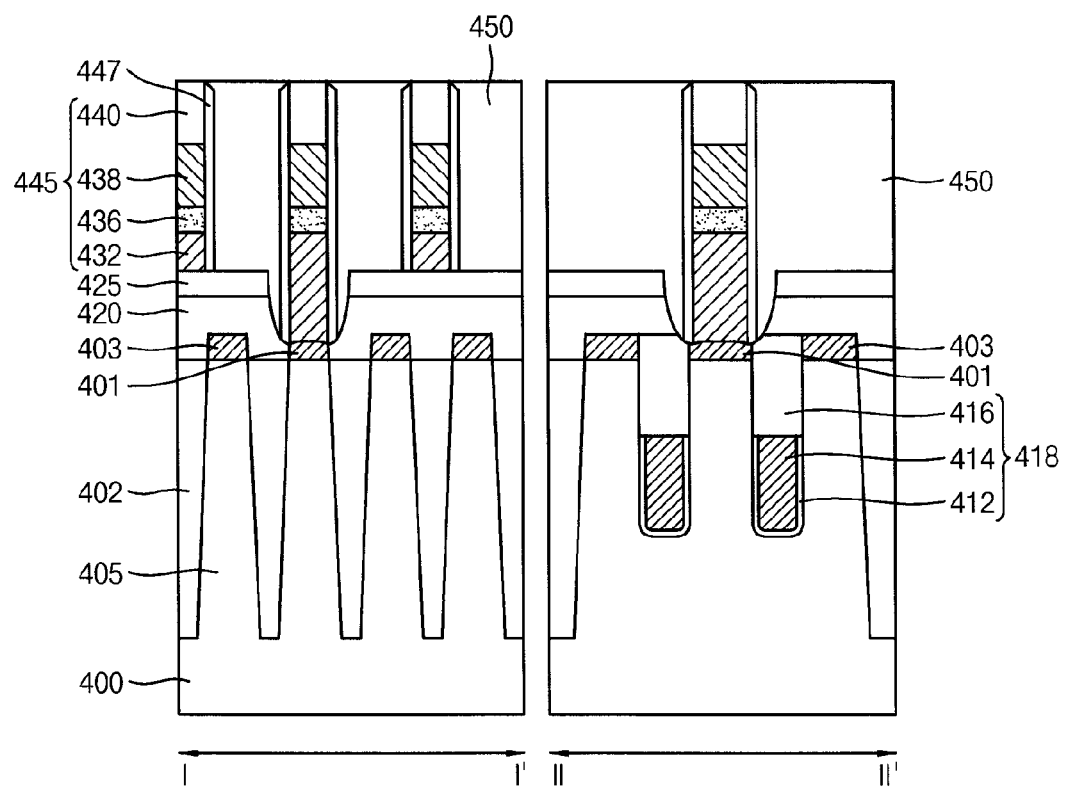

Referring to FIG. 66, a spacer 447 may be formed on the sidewall of the conductive line structure 445. For example, a spacer layer covering the conductive line structure 445 may be formed on the first insulating interlayer 425. The spacer layer may be anisotropically etched to form the spacer 447. The spacer layer may be formed of silicon nitride.

A second insulating interlayer 450 covering the conductive line structure 445 may be formed on the first insulating interlayer 425. The second insulating interlayer 450 may fill a remaining portion of the groove 427.

In some embodiments, an upper portion of the second insulating interlayer 450 may be planarized by a CMP process such that a top surface of the mask pattern 440 may be exposed. The second insulating interlayer 450 may be formed of silicon oxide substantially the same as or similar to that of the first insulating interlayer 425.

Figure 67:
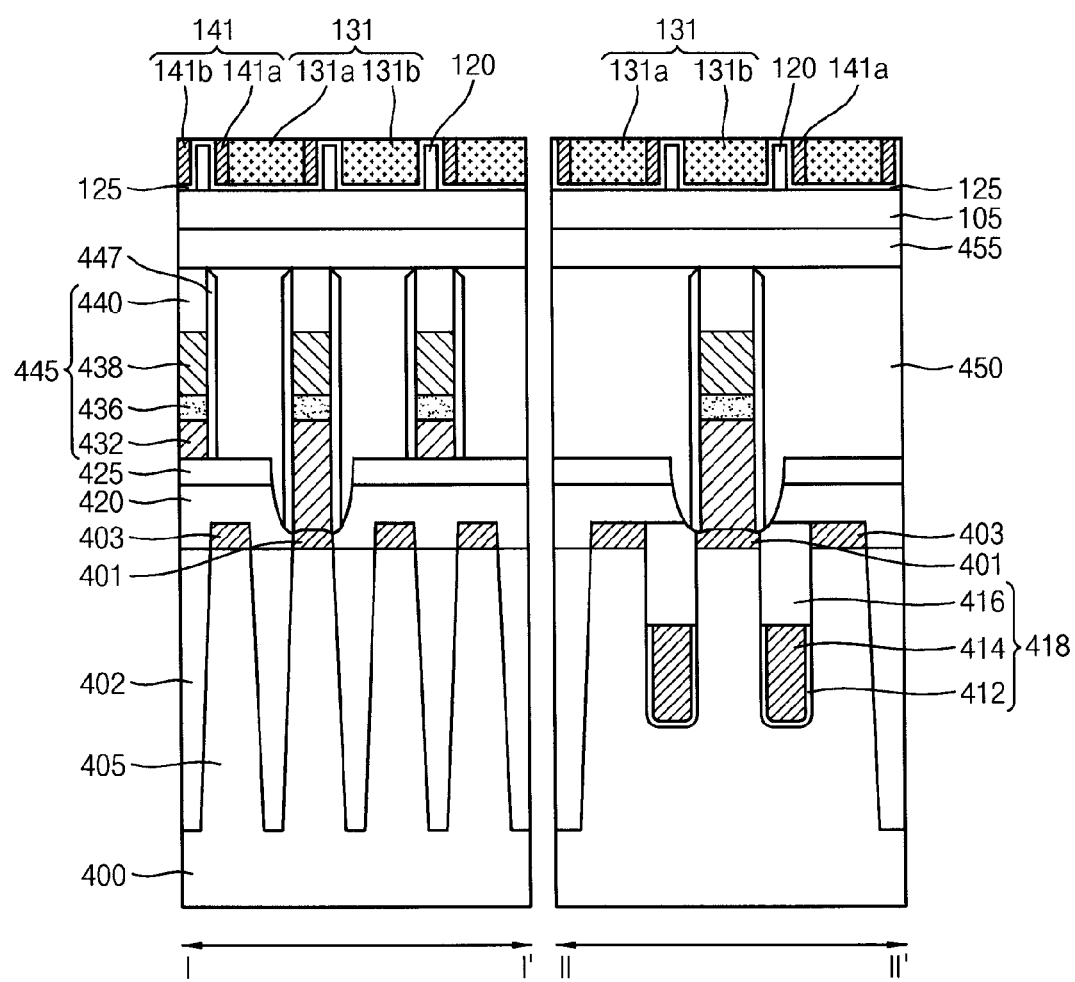

Referring to FIG. 67, a hard mask layer 455 may be formed on the mask pattern 440 and the second insulating interlayer 450 using, e.g., a silicon-based or carbon-based SOH material. A mask pattern structure may be formed on the hard mask layer 455 by processes substantially the same as or similar to those illustrated with reference to FIGS. 13 to 22.

Accordingly, an intermediate layer 105 may be formed on the hard mask layer 455, and a plurality of guide patterns 120 having a substantially ring shape may be formed on the intermediate layer 105. A neutral layer 125 may be formed along a top surface of the intermediate layer 105 and surfaces of the guide patterns 120, and a self-aligned layer may be formed on the intermediate layer 125.

A first polymer unit including, e.g., PMMA may be directed into an opening included in the guide pattern 120 to form a first pillar 131a. A second pillar 131b may be formed between the neighboring first pillars 131a and outside the guide patterns 120. Accordingly, a first self-aligned pattern 131 including the first pillar 131a and a second pillar 131b may be formed.

A second polymer unit including, e.g., PS may be directed into a peripheral portion of the opening, and outside the guide pattern 120 such that a second self-aligned pattern 141 including a first portion 141*a* and a second portion 141*b* may be formed.

In example embodiments, the first self-aligned pattern 131 may be superimposed at least partially over the second impurity region 403. For example, the first self-aligned pattern 131 may be formed per each hole formation area 457 (see FIG. 65A) to form a predetermined grid.

In some embodiments, the mask pattern structure may be formed by processes substantially the same as or similar to FIGS. 27 to 35, FIGS. 36 to 43, or FIGS. 44 to 51.

The mask pattern structure may have elements and/or constructions substantially the same as or similar to those illustrated with reference to FIGS. 1 and 2, FIGS. 3 and 4, FIGS. 5 and 6, FIGS. 7 and 8, FIGS. 9 and 10, or FIGS. 11 and 12.

Figure 68:
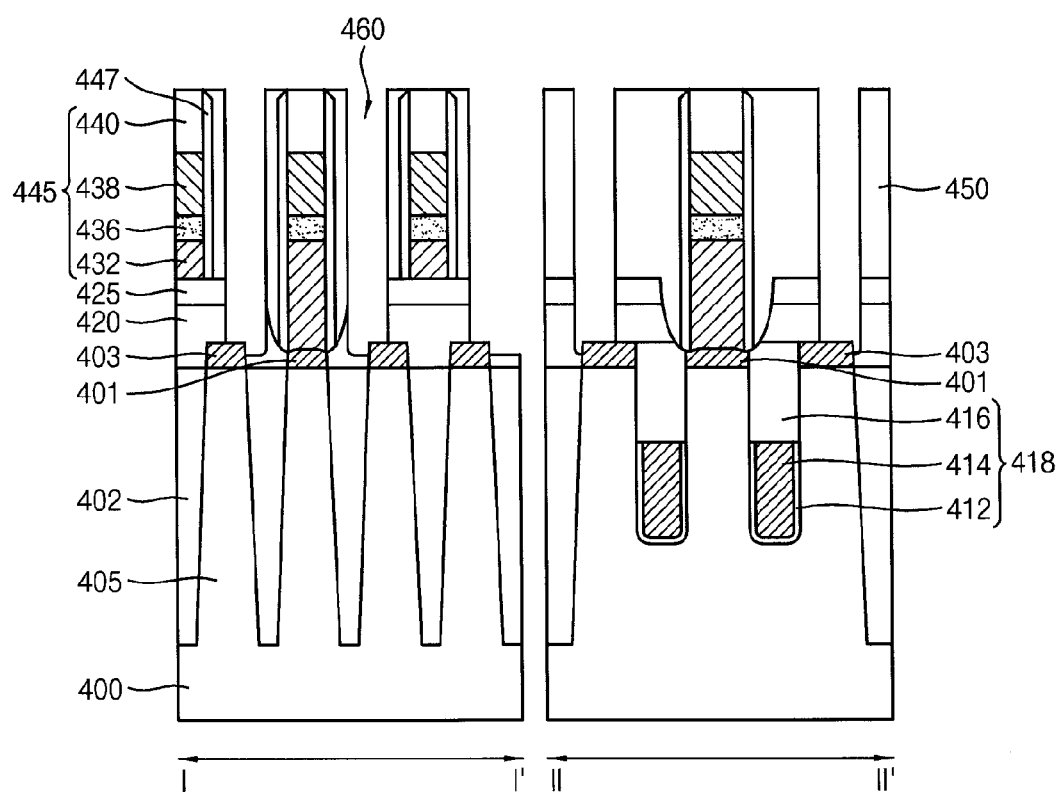

Referring to FIG. 68, the second insulating interlayer 450 may be partially removed to form a contact hole 460 through which the second impurity region 403 may be at least partially exposed.

In example embodiments, the first self-aligned patterns 131 may be removed to form preliminary holes, and the intermediate layer 105 and the hard mask layer 455 may be etched through the preliminary holes. Accordingly, the hard mask layer 455 may be converted into a hard mask including a plurality of holes extended from the preliminary holes.

The second insulating interlayer 450 may be partially etched using the hard mask as an etching mask to form the contact holes 460.

The hard mask, the second self-aligned pattern 140, the neutral layer 125, the guide pattern 120 and the intermediate layer 105 may be removed by a CMP process, an ashing process and/or a strip process.

Figure 69:
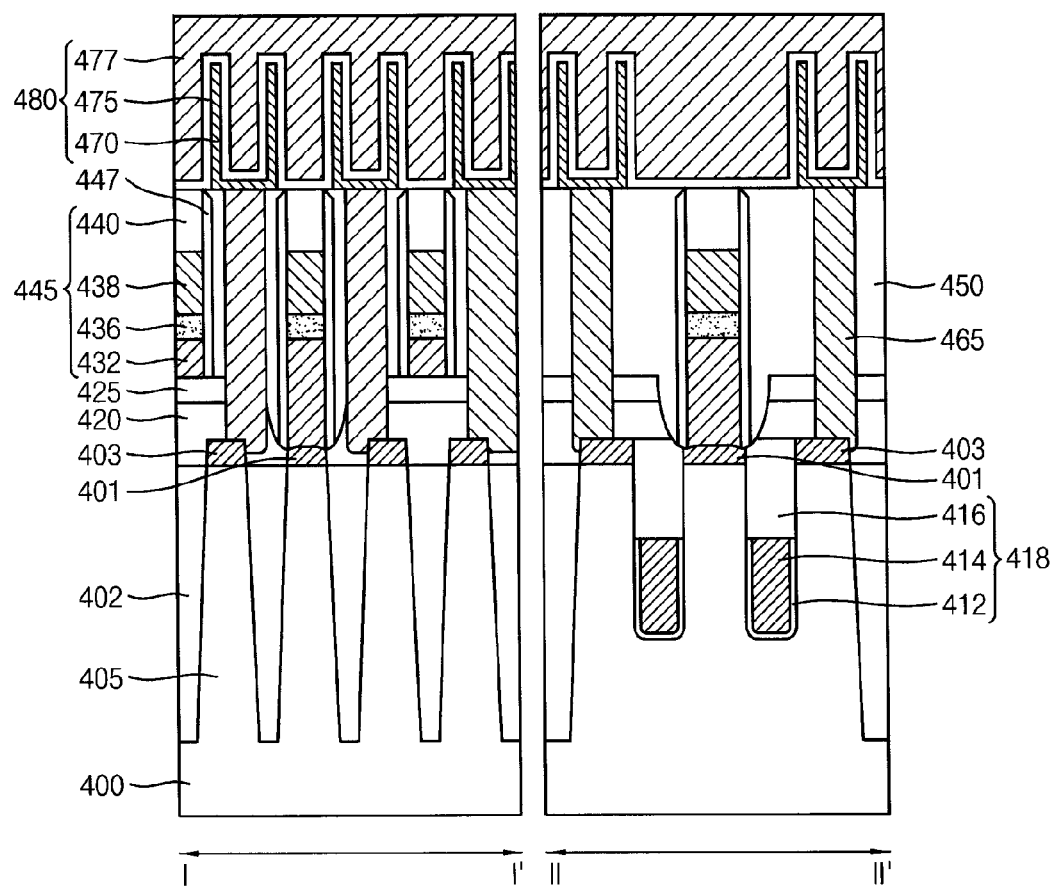

Referring to FIG. 69, a conductive contact 465 filling the contact hole 460 and being electrically connected to the second impurity region 403 may be formed. For example, a capacitor 480 may be formed on the conductive contact 465. In this case, the conductive contact 465 may serve as a capacitor contact.

A conductive layer filling the contact holes 460 may be formed, and an upper portion of the conductive layer may be planarized by a CMP process until the top surface of the mask pattern 440 is exposed. Accordingly, the conductive contact 465 may be formed in each contact hole 460, and may be in contact with the second impurity region 403.

The conductive layer may be formed using a metal such as copper or tungsten by a sputtering process, a PVD process, an ALD process, a CVD process, etc. In some embodiments, the conductive layer may be formed by an electroplating process or an electroless plating process. In some embodiments, a barrier conductive layer including titanium nitride or titanium may be formed on an innerwall of the contact hole 460 before the formation of the conductive layer.

Subsequently, the capacitor 480 electrically connected to the conductive contact 465 may be formed. Accordingly, a dynamic random access memory (DRAM) device having the BCAT structure may be obtained.

For example, an etch-stop layer and a mold layer (not illustrated) may be formed on the mask pattern 440, the second insulating interlayer 450 and the conductive contact 465. The mold layer and the etch-stop layer may be partially removed to form an opening through which a top surface of the conductive contact 465 is exposed.

A lower electrode layer may be formed along the innerwall of the opening and a top surface of the mold layer. A sacrificial layer (not illustrated) may be formed on the lower electrode layer, and upper portions of the sacrificial layer and the lower electrode layer may be planarized such that the top surface of the mold layer is exposed. The sacrificial layer and the mold layer may be removed to form a lower electrode 470.

The dielectric layer 475 may be formed along surfaces of the etch-stop layer and the lower electrode 470, and the upper electrode 477 may be formed on the dielectric layer 475 to form the capacitor 480. The dielectric layer 475 may be formed of silicon oxide or a metal oxide having a high dielectric constant. The lower and upper electrodes 470 and 477 may be formed of a metal or a metal nitride such as tungsten, tungsten nitride, titanium, titanium nitride, tantalum, tantalum nitride or ruthenium.

According to example embodiments as described above, the guide pattern 120 may be formed at the hole formation area 457 for a capacitor contact. Thus, the contact holes 460 may be formed without a grid distorsion. Therefore, the capacitor contacts in a highly integrated DRAM device may be formed while suppressing a mis-alignment.

According to example embodiments of the present applications, guide patterns having a cylindrical shape that includes an opening therein may be formed at predetermined points. A self-aligned layer including a block copolymer such as PS-b-PMMA may be formed on the guide patterns. A first self-aligned pattern including PMMA and having a pillar shape may be formed at a central portion of the opening, and between the neighboring guide patterns. A second self-aligned pattern including PS may be formed at a remaining portion of the opening, and at an outside of the guide patterns.

The first self-aligned pattern may be selectively removed to form a mask pattern structure. The self-aligned patterns may be formed by the guide patterns located at the predetermined points such that a mis-alignment of the self-aligned patterns may be prevented.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present application. Accordingly, all such modifications are intended to be included within the scope of the present application as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A method of forming holes, the method comprising:
   forming a plurality of guide patterns physically spaced apart from each other on an object layer, each of the guide patterns having a ring shape and including a first opening therein;
   forming a self-aligned layer in the first openings and between the guide patterns;

forming preliminary holes by removing portions of the self-aligned layer which are self-assembled in the first openings and between the guide patterns neighboring each other; and partially etching the object layer through the preliminary holes.

2. The method of claim 1, wherein:

the self-aligned layer is formed using a block copolymer that includes a first polymer unit and a second polymer unit different from each other, and forming the self-aligned layer includes forming a first self-aligned pattern self-assembled at a central portion of each of the first openings and between the guide patterns neighboring each other, and a second self-aligned pattern self-assembled on a remaining portion of the object layer except for a portion of the object layer on which the first self-aligned pattern is formed, the first self-aligned pattern and the second self-aligned pattern including the first polymer unit and the second polymer unit, respectively.

3. The method of claim 2, wherein:

the first self-aligned pattern includes a plurality of first pillars, each first pillar self-assembled at the central portion of one of the first openings, and each of a plurality of second pillars self-assembled between the guide patterns neighboring each other, and the plurality of the second pillars surround one of the guide patterns or one of the first pillars.

4. The method of claim 3, wherein the second pillars are self-assembled on central points of 2, 3 or 4 of the first pillars.

5. The method of claim 3, wherein the second self-aligned pattern is divided into first portions each of which is self-assembled at a peripheral portion of one of the first openings, and a second portion self-assembled at an outside of the guide patterns.

6. The method of claim 5, wherein:

each of the first portions of the second self-aligned pattern has a ring shape laterally surrounding one of the first pillars of the first self-aligned pattern, and the second pillars of the first self-aligned pattern are buried in the second portion of the second self-aligned pattern.

7. The method of claim 3, wherein forming the preliminary holes includes removing the first pillars and the second pillars.

8. The method of claim 2, wherein the first polymer unit includes polymethylmethacrylate (PMMA), and the second polymer unit includes polystyrene (PS).

9. The method of claim 1, further comprising forming a neutral layer along a surface of the object layer and along multiple surfaces of each of the guide patterns before forming the self-aligned layer.

10. The method of claim 1, wherein forming the plurality of the guide patterns includes:

forming a plurality of sacrificial layer patterns on the object layer, each of the sacrificial layer patterns having a pillar shape;

forming a guide layer along surfaces of the object layer and the sacrificial layer patterns;

partially removing the guide layer to form the guide pattern surrounding a sidewall of each of the sacrificial layer patterns; and removing the sacrificial layer patterns.

11. The method of claim 10, wherein partially removing the guide layer includes removing portions of the guide layer formed on top surfaces of the object layer and the sacrificial layer patterns by an etch-back process.

12. The method of claim 1, wherein forming the plurality of the guide patterns includes:

forming an intermediate layer on the object layer;

forming a plurality of sacrificial layer patterns on the intermediate layer, each of the sacrificial layer patterns having a pillar shape;

partially etching the intermediate layer using the sacrificial layer patterns to form a plurality of intermediate layer patterns that each have a pillar shape;

removing the sacrificial layer patterns;

forming a guide layer along surfaces of the object layer and the intermediate layer patterns;

partially removing the guide layer to form a guide pattern surrounding a sidewall of each of the intermediate layer patterns; and removing the intermediate layer patterns.

13. The method of claim 12, wherein the intermediate layer serves as an anti-reflection layer, and the sacrificial layer patterns include a negative-type photoresist material.

14. The method of claim 12, wherein partially etching the intermediate layer using the sacrificial layer patterns includes partially removing an upper portion of the object layer such that a stepped portion protruding from a top surface of the object layer is formed under each of the intermediate layer patterns.

15. The method of claim 14, wherein each of the guide patterns surrounding the sidewall of an intermediate layer pattern also surrounds a sidewall of a stepped portion corresponding to the intermediate layer pattern.

16. The method of claim 1, wherein forming the plurality of the guide patterns includes:

forming a sacrificial layer pattern that includes a plurality of openings therein on the object layer;

forming a guide layer on sidewalls and bottoms of the openings;

removing portions of the guide layer which are formed on the bottoms of the openings to form one of the guide patterns on the sidewall of each of the openings; and removing the sacrificial layer pattern.

17. The method of claim 16, further comprising:

forming an intermediate layer on the object layer before forming the sacrificial layer pattern; and partially removing the intermediate layer through the openings such that the openings are extended to expose the object layer.

18. The method of claim 17, further comprising partially etching an upper portion of the object layer exposed by the extended openings.

19. The method of claim 17, wherein the intermediate layer serves as an anti-reflection layer, and the sacrificial layer pattern includes a positive-type photoresist material.

20. A method of forming holes, the method comprising:

forming a sacrificial layer pattern on an object layer, the sacrificial layer pattern including a plurality of pillar patterns or a plurality of openings;

forming a guide layer along the object layer and the sacrificial layer pattern;

partially removing the guide layer to form guide patterns spaced apart from each other, each of the guide patterns having a ring shape;

removing the sacrificial layer pattern;

forming a self-aligned layer on the object layer to fill the guide patterns;

partially removing portions of the self-aligned layer which are self-assembled inside the guide patterns and between the guide patterns neighboring each other to form preliminary holes; and partially removing the object layer through the preliminary holes.

* * * * *